(12) United States Patent
Kamiyama et al.

(10) Patent No.: US 7,127,145 B2
(45) Date of Patent: Oct. 24, 2006

(54) SEMICONDUCTOR OPTICAL AMPLIFIER, AND OPTICAL MODULE USING THE SAME

(75) Inventors: Hiroyuki Kamiyama, Saitama (JP); Kenji Uchida, Yokohama (JP); Seiji Sumi, Yokohama (JP)

(73) Assignee: OpNext Japan, Inc., Yokohama (JP)

( * ) Notice: Subject to any disclaimer, the term of this patent is extended or adjusted under 35 U.S.C. 154(b) by 0 days.

(21) Appl. No.: 10/851,910

(22) Filed: May 20, 2004

(65) Prior Publication Data
US 2005/0025414 A1 Feb. 3, 2005

(30) Foreign Application Priority Data
Jul. 30, 2003 (JP) .............................. 2003-203605

(51) Int. Cl.
*G02B 6/10* (2006.01)
*H01S 3/00* (2006.01)

(52) U.S. Cl. .............................. 385/129; 385/2; 385/8; 385/130; 385/132; 359/333; 359/342; 359/344; 359/345; 359/346

(58) Field of Classification Search .................. 385/2, 385/8, 14–15, 129; 359/333, 342, 344–346; 327/43, 46, 49–50
See application file for complete search history.

(56) References Cited
U.S. PATENT DOCUMENTS

| | | | |
|---|---|---|---|
| 5,331,455 A * | 7/1994 | Chang | 359/344 |
| 5,477,379 A * | 12/1995 | Chang | 359/344 |
| 6,160,824 A * | 12/2000 | Meissner et al. | 372/7 |
| 6,347,104 B1 | 2/2002 | Dijaili et al. | |
| 6,445,495 B1 | 9/2002 | Walker et al. | |
| 6,597,497 B1 * | 7/2003 | Wang et al. | 359/344 |
| 6,803,604 B1 * | 10/2004 | Takahashi et al. | 257/80 |
| 6,928,099 B1 * | 8/2005 | Ledentsov et al. | 372/97 |
| 2002/0179929 A1 * | 12/2002 | Takahashi et al. | 257/184 |
| 2003/0067675 A1 * | 4/2003 | Wang et al. | 359/344 |
| 2003/0067676 A1 * | 4/2003 | Wang et al. | 359/344 |
| 2004/0057485 A1 * | 3/2004 | Ohki et al. | 372/46 |

* cited by examiner

*Primary Examiner*—Brian Healy
*Assistant Examiner*—Ryan Lepisto
(74) *Attorney, Agent, or Firm*—Townsend and Townsend and Crew LLP

(57) ABSTRACT

The present invention provides a polarization dependency-free, gain-saturated high function semiconductor optical amplifier and optical module at industrially low cost. The gist of the present invention is to structurally separate the optical signal propagating waveguide from another optical waveguide which serves as a lasing optical cavity for optical amplification in such a manner that the two optical waveguides are formed in the same plane but not parallel to each other.

12 Claims, 18 Drawing Sheets

SEMICONDUCTOR OPTICAL AMPLIFIER, AND OPTICAL MODULE USING THE SAME

The present application claims priority from Japanese application JP2003-203605 filed on Jul. 30, 2003, the content of which is hereby incorporated by reference into this application.

BACKGROUND OF THE INVENTION

1. Field of the Invention

The present invention relates to optical communications systems. More particularly, the invention relates to optical amplifiers and to modules using them.

2. Related Arts

Optical communications systems are rapidly becoming a widespread and important technology in telecommunications and networking. Optical communications systems transmit information optically at very high-speeds over fiber optics. The key optical components of an optical communications system include optical amplifiers, in particular, semiconductor optical amplifiers. In optical communications systems, optical amplifiers are used to, for example, attenuate optical signals therein.

There have been known semiconductor optical amplifiers. One representative type of semiconductor optical amplifier comprises an optical cavity which resembles that of a semiconductor laser and is operated below the lasing threshold. Another representative semiconductor optical amplifier is a tunable-gain semiconductor optical amplifier which controls the gain in the active region. In the former example, carriers are pumped by injecting current into the optical cavity. As the optical signal passes through this region, it is amplified based on the emission stimulated by pumped carriers. One example of the latter type comprises an optical cavity which lases in the substrate's vertical direction perpendicular to the optical axis of the optical signal. The gain in this active region is controlled. Another gain-tunable semiconductor optical amplifier is also known which is a gain-fixed semiconductor amplifier connected in series with a variable attenuator. These examples are disclosed in such documents as U.S. Pat. No. 6,347,104 entitled "Optical signal power monitor and regulator" (Patent Document 1) and U.S. Pat. No. 6,445,495 entitled "Tunable-gain semiconductor optical amplifier" (Patent Document 2).

[Patent Document 1]
U.S. Pat. No. 6,347,104 (lines 14 to 43 column 16, FIGS. 3A and 3B)

[Patent Document 2]
U.S. Pat. No. 6,445,495 (lines 24 to 46 column 2, FIG. 8A)

One problem with conventional optical amplifiers is that the gain changes depending on the intensity of the incident optical signal and is not saturate. Although gain-tunable semiconductor optical amplifiers have been proposed to cope with this problem, these examples have yet to solve such problems as spectrum broadening due to spontaneous emission and rising of the noise level caused by the broadening spectrum. In the case of a semiconductor optical amplifier connected in series with a variable attenuator, it is involved with yet another problem of increased elements.

SUMMARY OF THE INVENTION

The above-mentioned problems are overcome by the present invention as described briefly below.

In a semiconductor optical amplifier of the present invention, a first optical waveguide to propagate the incident optical signal and an optical amplification section to amplify the optical signal are provided. The optical amplification section uses only optical pumping to pump carriers for stimulated emission. Stimulated emission in the optical amplification section is introduced into the first optical waveguide in order to amplify the optical signal which propagate therein. Typically, this optical pumping is done with an optical waveguide/cavity structure formed not parallel to the first optical waveguide. More specifically, laser light is obtained by the lasing optical waveguide/cavity structure formed in the same plane but not parallel to the optical waveguide that propagates the incident optical signal. By the laser light going across a part or the whole of the optical waveguide which propagates the optical signal, carriers are optically pumped in the optical waveguide which propagates the optical signal. The pumped carriers stimulate emission and therefore amplify the optical signal. The optical amplification section and the introduction of light into the first optical waveguide may be implemented in various styles as described later.

In a semiconductor optical amplifier of another embodiment of the present invention, one or more desired optical or optoelectronic parts/elements are integrated at the input end and/or output end of the first optical waveguide which propagates the optical signal. The integrated elements add new functions to the semiconductor optical amplifier.

Yet another embodiment of the present invention is an optical module using a semiconductor optical amplifier of the present invention. The present invention can provide an optical module whose change of gain depending on the intensity of the incident optical signal is substantially eliminated.

PREFERRED EMBODIMENT OF THE INVENTION

Figure 1A:
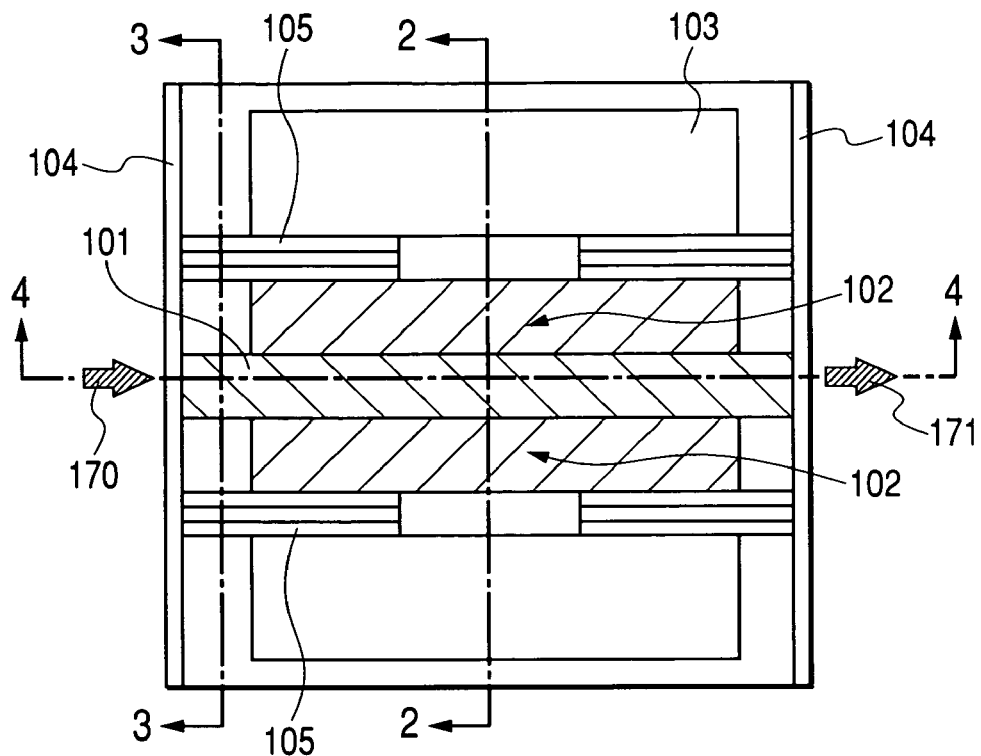
FIGS. 1A and 1B are top views of a semiconductor optical amplifier according to a first embodiment of the present invention.
Figure 1B:
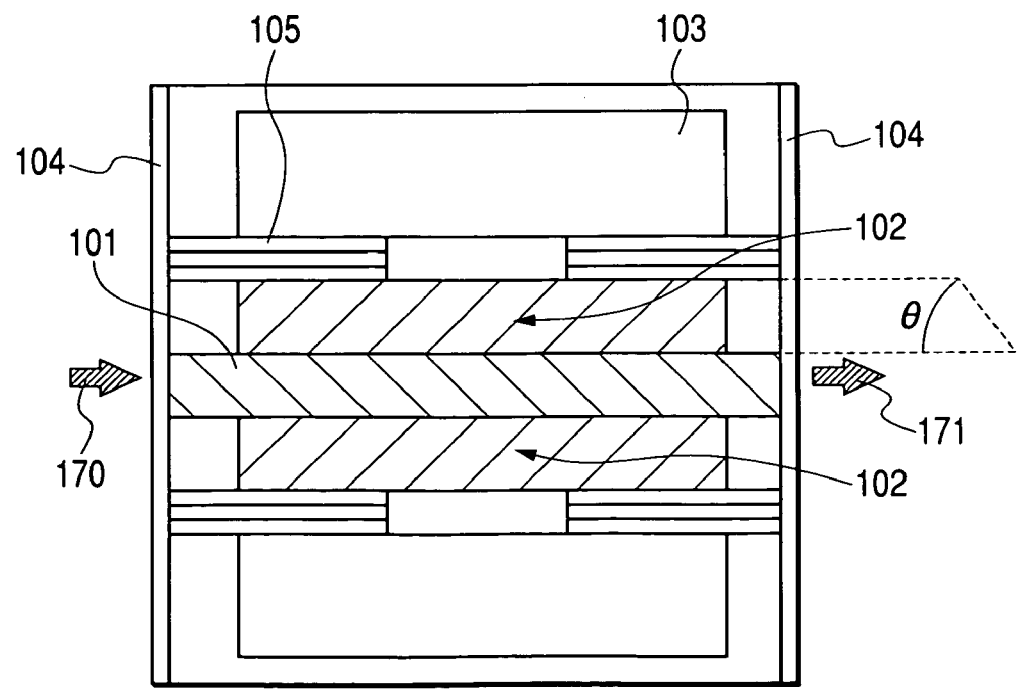

Before proceeding to specific embodiments, the following provides a detailed description of general matters concerning the present invention. FIG. 1A is a top view of a representative embodiment of the present invention. Note that although the present invention is concretely described by using the embodiment of FIG. 1A, this does not mean the principle of the present invention is applied only to this embodiment. There are provided a first optical guide 101 to guide an incident signal 170, optical waveguide region for lasing 102 that are formed in the same plane as but not parallel to the first optical guide 101. Each layer of them can be formed by ordinary semiconductor process. Note that in the interest of process operation, the semiconductor optical cavity is sometimes formed such that its incidence and emission facets are not perpendicular to, that is, lie at an angle to the optical axis of the first optical waveguide. In this case, due to the dependence of etching on the crystal structure, grooves to form reflectors for lasing oscillation become not perpendicular to the facets. FIG. 1B is a top view of this configuration. Each part is similar to that in FIG. 1A. In FIG. 1B, the angle between the extension of the optical axis of the first optical waveguide and the extension of a side, closer to the first optical waveguide, of each groove to form a reflector for lasing oscillation is schematically depicted as intersection angle $\theta$. Practically, considering the relationship between air, the refractive index of the InP based compound semiconductor and the Brewster angle, this intersection angle $\theta$ is set in the range of about 4 to 7 degrees.

Typically, the optical waveguide at least includes a core layer and two cladding layers which sandwiches the core layer. Further, the core layer and other layers may employ a multi quantum well structure. For example, a multi quantum well structure is formed by repeatedly stacking InGaAs/InGaAsP.

This optical cavity structure can stage lasing oscillation. By letting laser light go across a part or the whole of the optical signal propagation waveguide, the optical cavity structure optically pumps carries in the optical signal propagation waveguide in order to cause stimulated emission there. The optical signal is amplified by this stimulated emission.

In this case, pumped carriers are consumed for amplification but immediately replenished by the incident laser light from the direction transverse to the propagating direction of the optical signal. The pumped carrier population, that is, the population inversion is kept constant not depending on the power level of the input optical signal. Thus, it is possible to saturate the gain as a semiconductor optical amplifier.

In addition, since the optical waveguide region for lasing 102 and the optical signal propagation optical waveguide regions 101, each made of a semiconductor multi-layered structure, are separated structurally from each other, the section of the optical signal propagation waveguide cut perpendicular to the propagating direction (optical axis) of light can be made substantially square. Therefore, any section perpendicular to the propagating direction of light has a circular area where the gain is substantially uniform for any direction in the plane. Thus, this can solve the problem that conventional semiconductor optical amplifiers have polarization dependency, that is, take gains differing in dependence on polarization.

The structural separation of the optical signal propagating waveguide from the lasing waveguide according to the present invention is also effective in minimizing the broadening of the spectrum and the accompanied rising noise level. If a surface emission laser is used, current is injected into the optical signal waveguide, too. In this case, pumping is partly made by the current, which causes spontaneous emission and therefore broadens the spectrum and raises the noise level.

In addition, it is necessary to lower the resistance of the current path by doping p-type or n-type impurities into the cladding layers up to a certain density level since the current path goes through the signal propagation waveguide. In the case of the structure according to the present invention, since the optical signal is separated from the lasing waveguide, it is not necessary to dope the cladding layers of the optical signal propagation waveguide. Loss due to impurities can therefore be prevented.

Note that in the embodiment of the present invention, the wavelength of the optical signal is set equal to or shorter than the composition wavelength of the medium of the relevant optical waveguide; the lasing wavelength for optical amplification is set equal to or shorter than the composition wavelength of the medium of the relevant optical waveguide; and, the lasing wavelength is set equal to or shorter than the optical signal wavelength. That is, these relations can be represented by: [Laser Light Wavelength] ≦[Optical Signal Wavelength]≦[Composition Wavelength of Optical Waveguide Medium]. Preferably, the optical signal wavelength is equal to the composition wavelength of the optical waveguide medium.

The optical feedback parts to constitute an optical cavity using the second optical waveguide in accordance with the present invention can satisfactorily be fabricated by such methods as employed for ordinary semiconductor lasing cavities. One representative example method is to form reflective surfaces either by dry etching or cleaving both the facets. After that, either a dielectric multi-layered film or a semiconductor multi-layered mirror film is typically formed on these reflective surfaces. The present invention also allows this embodiment to be modified such that the optical feedback means is implemented by forming a grating either in each semiconductor layer of the second optical waveguide or in a region where the laser light is sensitive.

In addition to using the second optical waveguide, constituting an optical cavity, provided on both the sides of the first optical waveguide, the present invention also allows the perpendicular multi-layered structure region of the semiconductor optical amplifier to be used partly in constituting an optical cavity. That is, a 45-degree reflector mirror is formed along each facet of the second optical waveguide so that light can be reflected toward the substrate of the semiconductor optical amplifier by each 45-degree reflector mirror. Then an optical cavity is constituted by forming a reflecting part in a light path on the substrate side for each reflector mirror. In many cases, the reflecting parts are formed on the top or bottom side of the substrate since they are easy to form there. Together with them, an appropriate region of the multi-layered structure of the second optical waveguide or the semiconductor optical amplifier is used to constitute an optical cavity. Note that the 45-degree reflector mirror means a reflector mirror which makes an angle of 45 degrees with the propagating direction of light in the second optical waveguide. For example, this 45-degree reflector mirror can be formed through crystal orientation-dependent wet etching of the semiconductor multi-layered structure.

Further, needless to say, the present invention allows the semiconductor optical amplifier to incorporate one or more desired optical or optoelectronic parts/elements at the input end and/or output end of the first optical waveguide or optical signal propagation waveguide.

Figure 17:
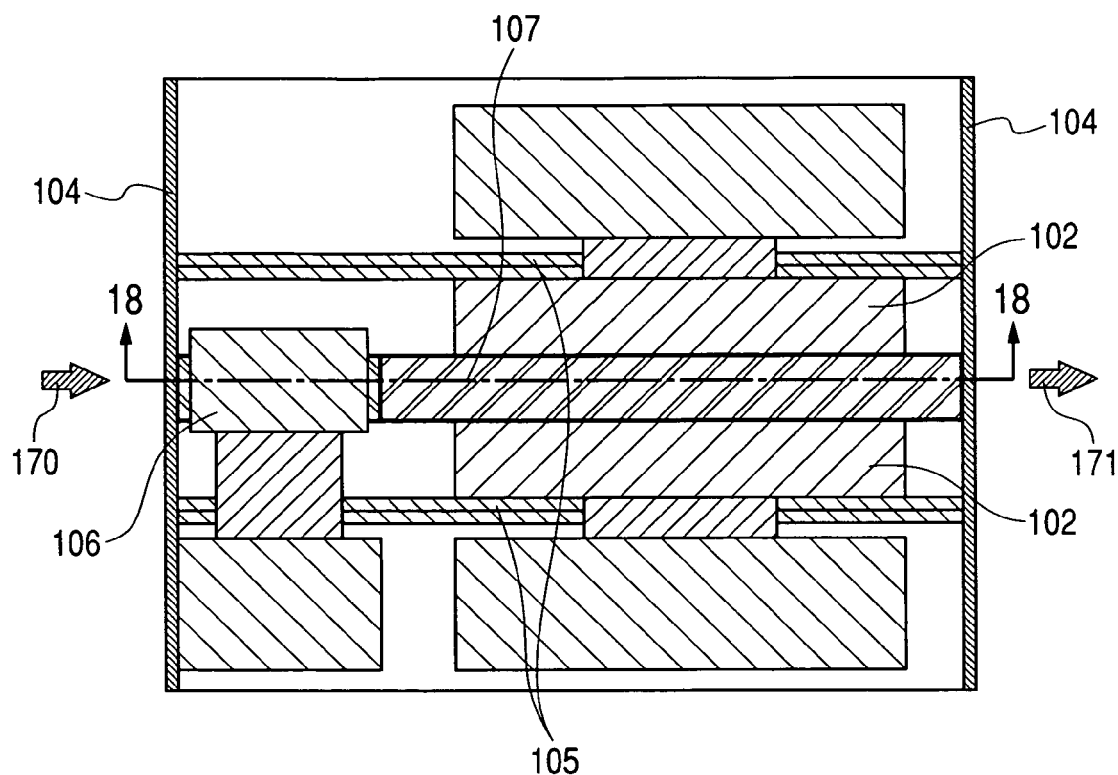
FIG. 17 is a top view of a semiconductor optical amplifier in which a variable attenuator is integrated at the input end of the semiconductor optical amplification section, according to a fifth embodiment of the present invention.
Figure 20:
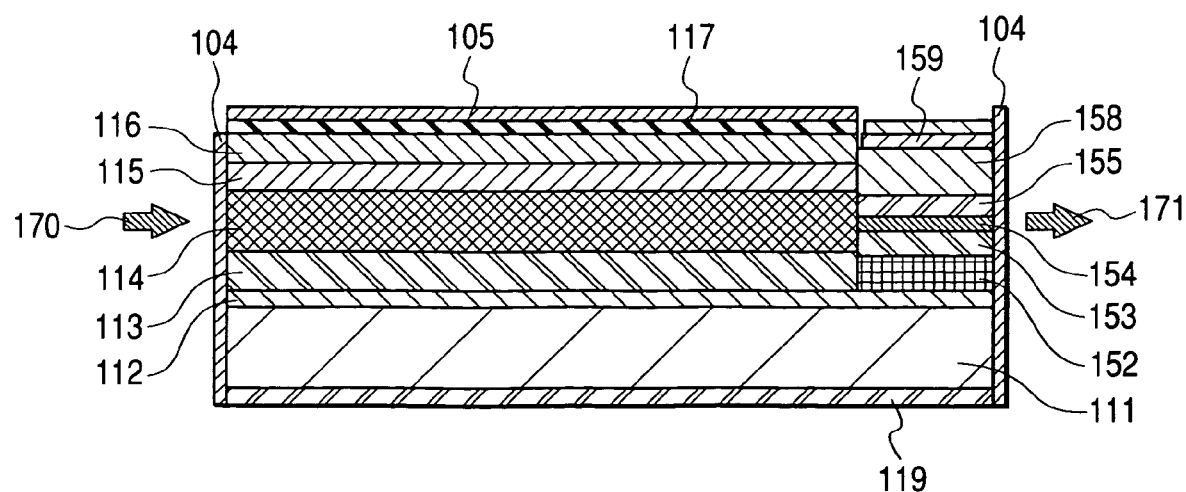
FIG. 20 shows a cross-sectional view of the semiconductor optical amplifier according to the fifth embodiment of the present invention in which a variable attenuator is integrated at the output end of the semiconductor optical amplification section, taken along line 20—20 indicated in FIG. 19.
Figure 21:
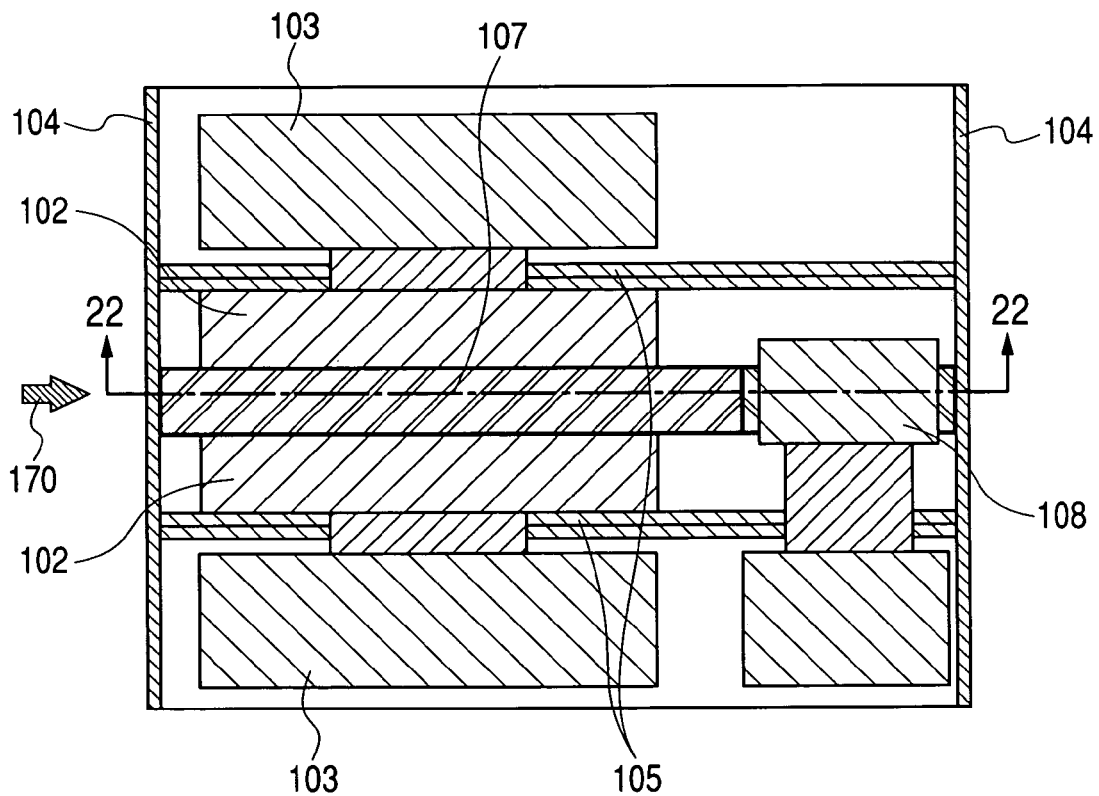
FIG. 21 is a top view of a semiconductor optical amplifier in which a photo acceptance element is integrated, according to a sixth embodiment of the present invention.

Specific examples are as follows: A first example is shown in FIG. 17 where an electro absorption type VOA (Variable Optical Attenuator) is fabricated in the front of the optical signal propagation waveguide in order to control the input optical power level. A second example is shown in FIG. 20 where an electro absorption type VOA is fabricated in the rear of the optical signal propagation waveguide in order to control the output optical power level. A third example is shown in FIG. 21 where a PIN photodiode is fabricated in the rear of the optical signal propagation in order to constitute an optical preamplifier.

Major modes of the present invention are summarized below.

A first mode is a semiconductor optical amplifier comprising a first optical waveguide which propagates an input optical signal; and an optical amplification section, which amplifies the optical signal by causing stimulated emission with radiation incident on the first optical guide or with a cavity structure formed in the direction which intersects the optical propagating direction of the first optical waveguide.

A second mode is that any gain medium to amplify light is not provided around the optical input surface of the first optical waveguide which propagates the input optical signal.

A third mode is that a part or the whole of the gain medium of the first optical waveguide which propagates the input optical signal is used also as a part or the whole of the gain medium of the optical amplification section which amplifies the optical signal.

A fourth embodiment is that a part or the whole of the gain medium of the first optical waveguide which propagates the input optical signal is used also as a part of the gain medium of the optical amplification section which amplifies the optical signal; or the gain medium used in the first optical waveguide is different in composition from the gain medium used in a portion which generates radiation incident on the first optical waveguide.

A fifth mode is that photonic crystal is provided along each side of the first optical waveguide which propagates the input optical signal; and with a cavity structure formed in the direction which intersects the optical propagating direction of the first optical waveguide, the optical signal is amplified by causing stimulated emission.

A sixth mode is that, without injecting current into the first optical waveguide which propagates the input optical signal, the optical signal is amplified by causing stimulated emission by optically pumping carriers in the first optical waveguide with radiation incident on the first optical waveguide from the direction which is included in a plane parallel to the first optical waveguide and intersects the optical propagating direction of the first optical waveguide.

Major modes of the present are descried so far. Needless to say, these modes may be combined as required by the device to be implemented according to the present invention.

<Embodiment 1>

Figure 2:
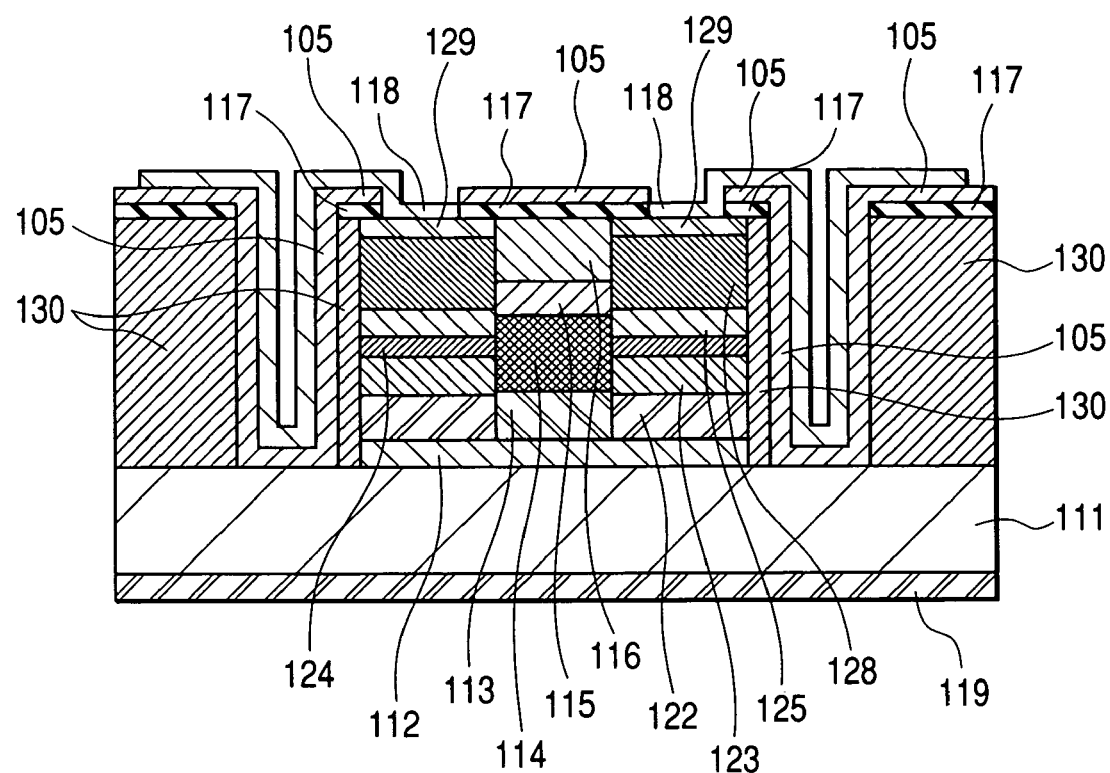
FIG. 2 is a cross-sectional view of the semiconductor optical amplifier according to the first embodiment taken along line 2—2 indicated in FIG. 1A.
Figure 3:
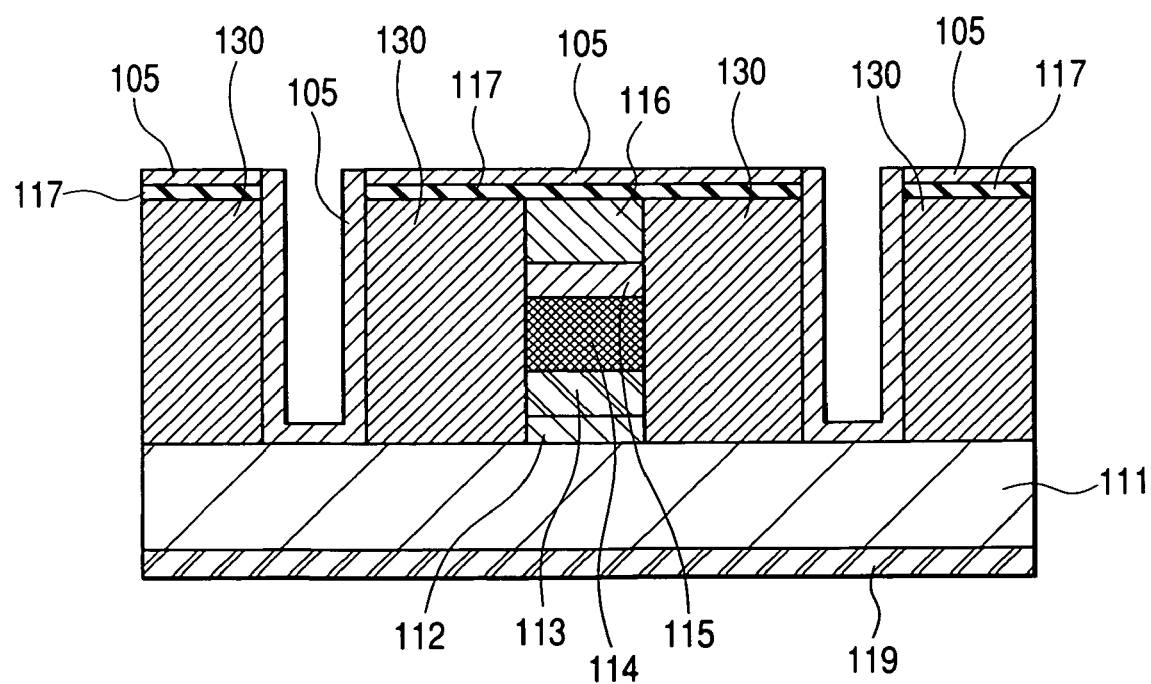
FIG. 3 is a cross-sectional view of the semiconductor optical amplifier according to the first embodiment, taken along line 3—3 indicated in FIG. 1A
Figure 4:
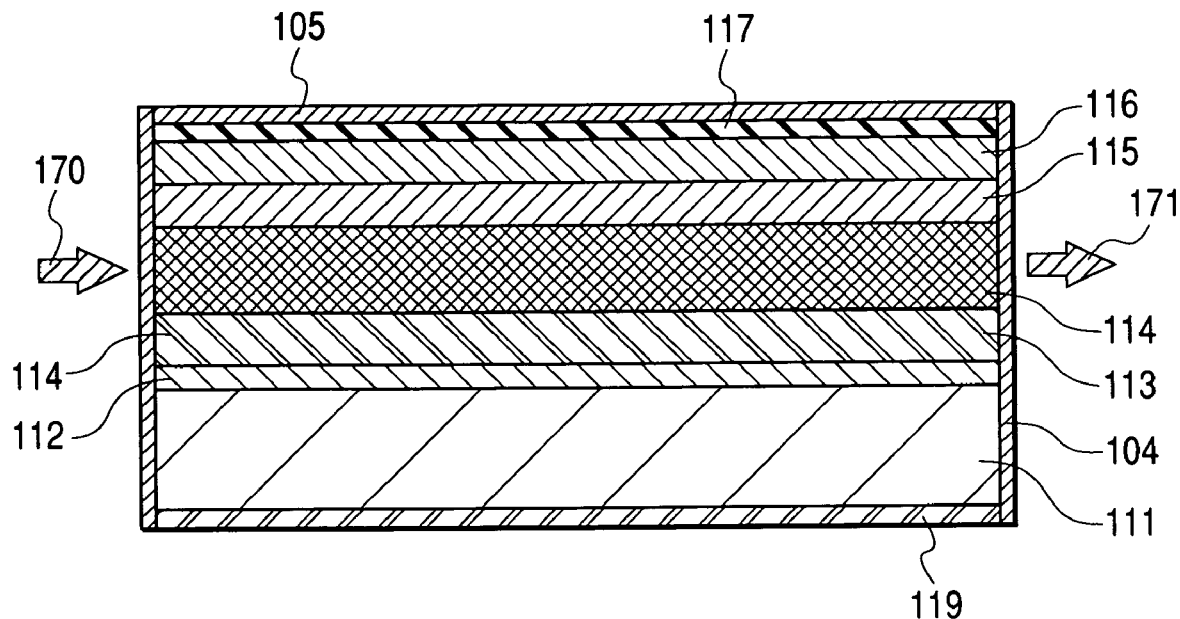
FIG. 4 is a cross-sectional view of the semiconductor optical amplifier of the first embodiment, taken along line 4—4 indicated in FIG. 1A.

The following describes a semiconductor optical amplifier having one lasing cavity structure according to a first embodiment with reference to FIG. 1 through FIG. 4. As described earlier, FIG. 1A is a top view. FIG. 2 shows a section taken along line 2—2 indicated in FIG. 1. FIG. 3 shows a section taken along line 3—3 indicated in FIG. 1. FIG. 4 is a section taken along line 4—4 indicated in FIG. 1.

Referring to FIG. 1A, the following describes the basic operation of this embodiment. From the left side, an optical signal 170 is input to an optical waveguide 101 shown in the center of the figure. The optical signal 170 is amplified as it passes through an optical waveguide region for lasing 102, and is output as output light 171 from the right side of the optical waveguide 101. In FIG. 1, reference numeral 101 denotes an optical waveguide for the optical signal, 102 is an optical waveguide region for lasing, 103 is a bottom electrode pad, 104 is an antireflection coating formed on each end surface of the optical signal waveguide, and 105 is a coating for the lasing cavity. In this embodiment, the crystal facets to form the lasing cavity are obtained by dry etching although they may also be obtained by cleaving.

Shown in FIG. 3 is a section taken along 3—3 indicated in FIG. 1. The multi-layered structure of the optical signal waveguide 101 is formed on an InP substrate (n-type, $2\times10^{18}$ cm$^{-3}$, 100 μm) 111 by stacking an InP buffer layer (n-type, $1\times10^{18}$ cm$^{-3}$, 0.15 μm) 112, an InGaAsP cladding layer (none-dope, thickness 0.3 μm, λg=1.15 μm) 113, an InGaAsP waveguide layer (none-dope, thickness 0.8 μm, λg=1.55 μm) 114, an InGaAsP cladding layer (none-dope, thickness 0.3 μm, λg=1.15 μm) 115, an InP cap layer (none-dope, thickness 1.0 μm) 116 and an insulating film (SiN, thickness 0.5 μm) 117. Above, and throughout the remainder of this description, whenever information is provided within parentheses, it should be interpreted as first specifying the dopant type, second the impurity concentration of that dopant, and third the thickness of the layer to which reference is made.

Shown in FIG. 2 is a section along 2—2 indicated in FIG. 1. Referring to FIG. 2, the multi-layered structure of the lasing cavity part is described. The lasing cavity part is formed so as to sandwich the optical waveguide part 101 from both sides. A lasing cavity is constituted by the optical waveguide part 101 and the multi-layered structure described below. The axial direction of the lasing cavity intersects with the propagating direction of the optical signal.

The multi-layered structure which sandwiches the optical waveguide part 101 from both sides is fabricated by stacking an InP buffer layer (n-type, $1\times10^{18}$ cm$^{-3}$, thickness 0.15 μm) 112, an InGaAsP cladding layer (n-type, $5\times10^{18}$ cm$^{-3}$, thickness 0.2 μm, ëg=1.05 μm) 122, an InGaAsP SCH layer (n-type, $1\times10^{17}$ cm$^{-3}$, thickness 0.2 μm, ëg=1.15 μm) 123, an InGaAsP MQW (Multi-quantum Well) active layer (none-dope, well layer thickness 10 nm/ëg=1.55 μm, barrier layer thickness 10 nm/ëg=1.3 μm, 10 periods) 124, an InGaAsP SCH layer (p-type, $1\times10^{17}$ cm$^{-3}$, thickness 0.2 μm, ëg=1.15 μm) 125, an InP cladding layer (p-type, $5\times10^{17}$ cm$^{-3}$, thickness 1.5 μm) 128, an InGaAs contact layer (p-type, $2\times10^{19}$ cm$^{-3}$, thickness 0.1 μm) 129, an insulation film (SiN, thickness 0.5 μm) 117 and a p electrode (Ti/Pt/Au) 118 on the InP substrate 111. On the bottom of the substrate 111, a n electrode (Ni/AuGe/Au) 119 is formed.

Note that a semiconductor layer (for example a barrier layer) may be inserted between the semiconductor multi-layered region constituting the first optical waveguide and the semiconductor multi-layered region constituting the second optical waveguide in order to block the diffusion of impurities. Not limited to this embodiment, this semiconductor layer may be added to the other embodiments of the present invention.

FIG. 4 shows a longitudinal section of the optical signal waveguide taken along the direction of propagation. The same multi-layered structure as the optical waveguide in FIG. 2 and FIG. 3 is shown. Therefore, this figure is not described in detail.

The following describes an example of a method for fabricate the aforementioned semiconductor multi-layered structures. Firstly, the first semiconductor multi-layered structure constituting the first optical waveguide is formed on the substrate 111. The first semiconductor multi-layered structure may be formed wider and processed to a desired width. It is also possible to stack the respective layers having the desired width. Then, the second semiconductor multi-layered structure constituting the aforementioned optical amplifier part is formed in parallel with the optical axis of the first semiconductor multi-layered structure and in contact with the longitudinal sides thereof. After the first and second semiconductor multi-layered structures are shaped as desired, a semi-insulation semiconductor layer 130, such as a semi-insulation InP buried layer, is formed so as to surround them. Then, after groove parts are formed along the boundaries of the semi-insulation semiconductor layers 130 surrounding the second semiconductor multi-layered structure, a coating film 105 is deposited in the groove parts to form a lasing cavity. These groove parts can be formed either by dry etching or cleaving as mentioned earlier. Note that this coating film 105 can be deposited in other regions unless improper in terms of manufacture although the coating film 105 is not particularly required besides both sides of the lasing cavity. Further, an antireflection coating 104 is formed over each facet of the first optical waveguide which propagates the optical signal. Then, a p-type electrode 118 and a n-type electrode 119 are formed to complete an optical amplifier.

Figure 5:
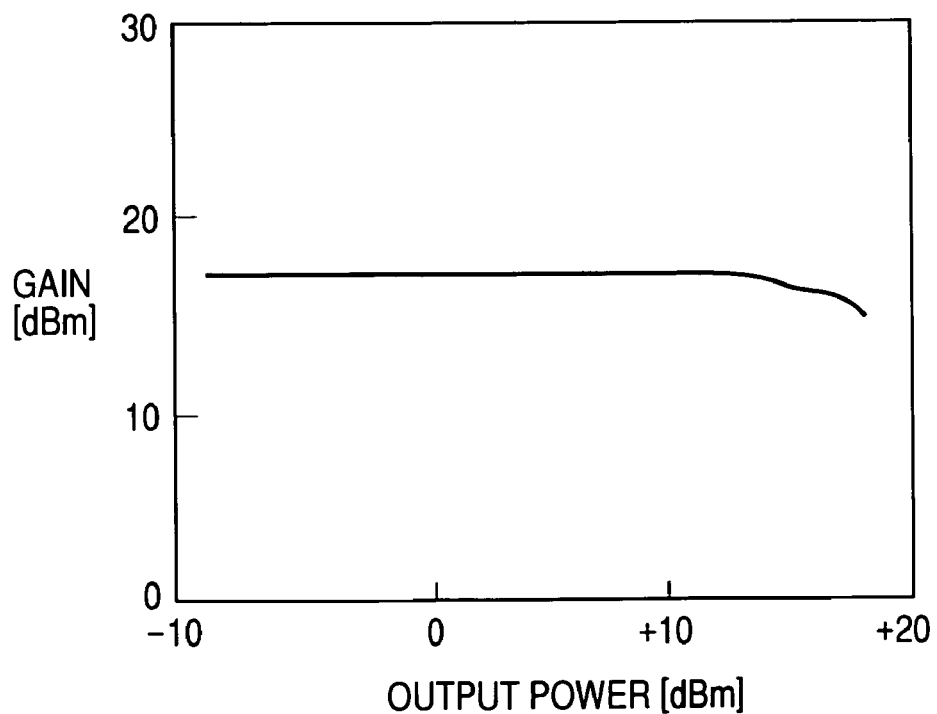
FIG. 5 shows an example of gain characteristics of the semiconductor optical amplifier of the first embodiment of the present invention.

The gain characteristic of this semiconductor amplifier according to the present invention was measured. The semiconductor amplifier was set on a sub-mount and aligned with lenses and fibers. FIG. 5 shows some of the result. The horizontal axis represents the optical output power whereas the vertical axis represents the gain. As shown in FIG. 5, it is verified that the gain, or the ratio of the output signal to the input signal, is almost constant or saturated at about 16 dB not depending on the power level of the input optical signal. It is also verified that the gain is free from polarization dependency thanks to the substantially square cross section of the optical waveguide which propagates the optical signal.

In addition, advantages are brought about by the structural separation of the lasing optical waveguide from the optical signal propagation waveguide. To be more specific, since no current is injected into the optical signal propagation waveguide, spectrum broadening due to spontaneous emission can be minimized, which results in a lower level of noise. In addition, since the cladding layers in the optical signal propagation waveguide are not doped in this optical amplifier, loss due to impurities in the optical waveguide can be prevented.

In addition, since an optical waveguide structure, instead of a surface emission structure, is employed as the cavity structure to generate pumping laser light, it is possible to raise the intensity of the pumping light.

<Embodiment 2>

Figure 6:
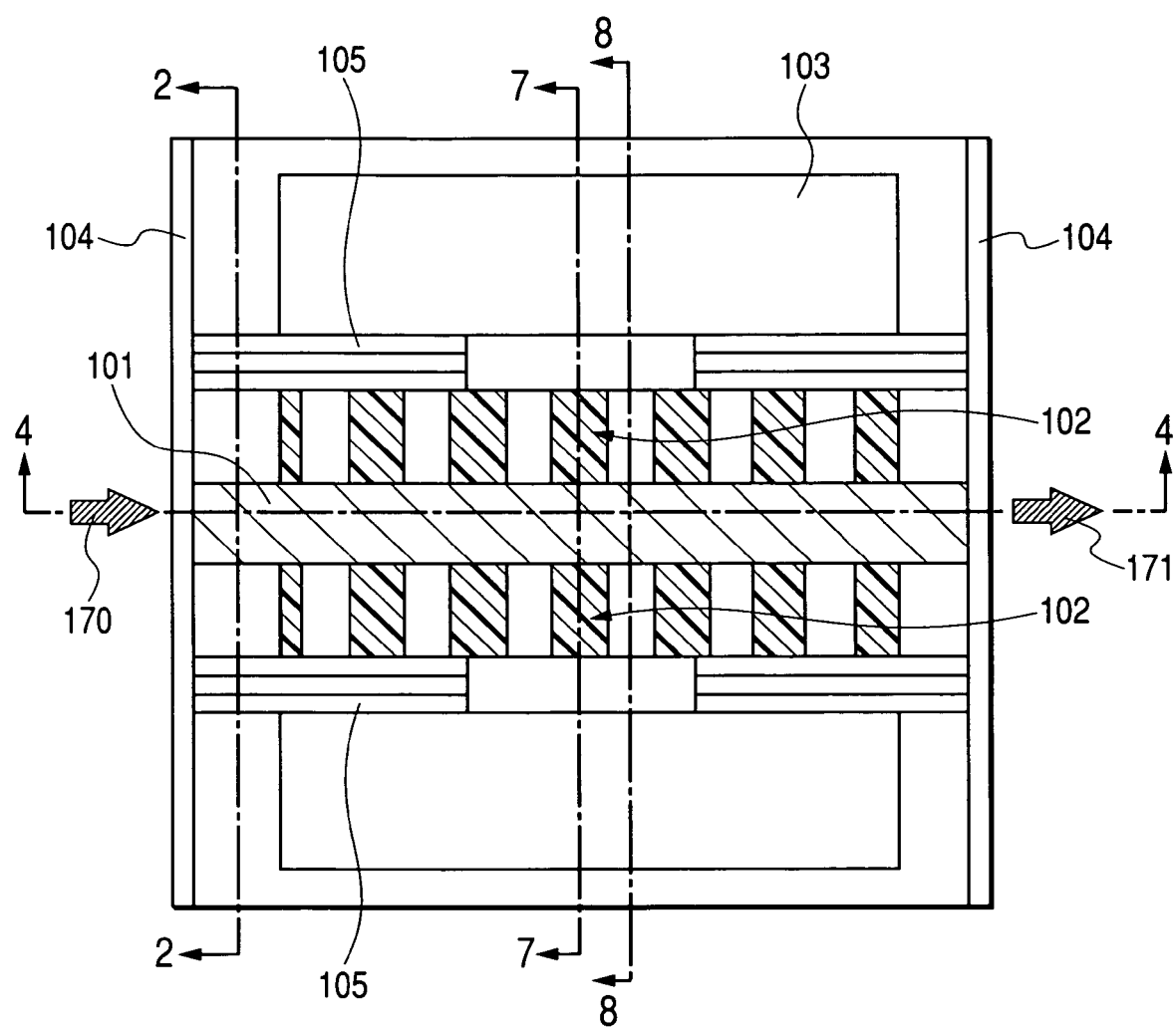
FIGS. 6 is a top view of a semiconductor optical amplifier according to a second embodiment of the present invention.
Figure 7:
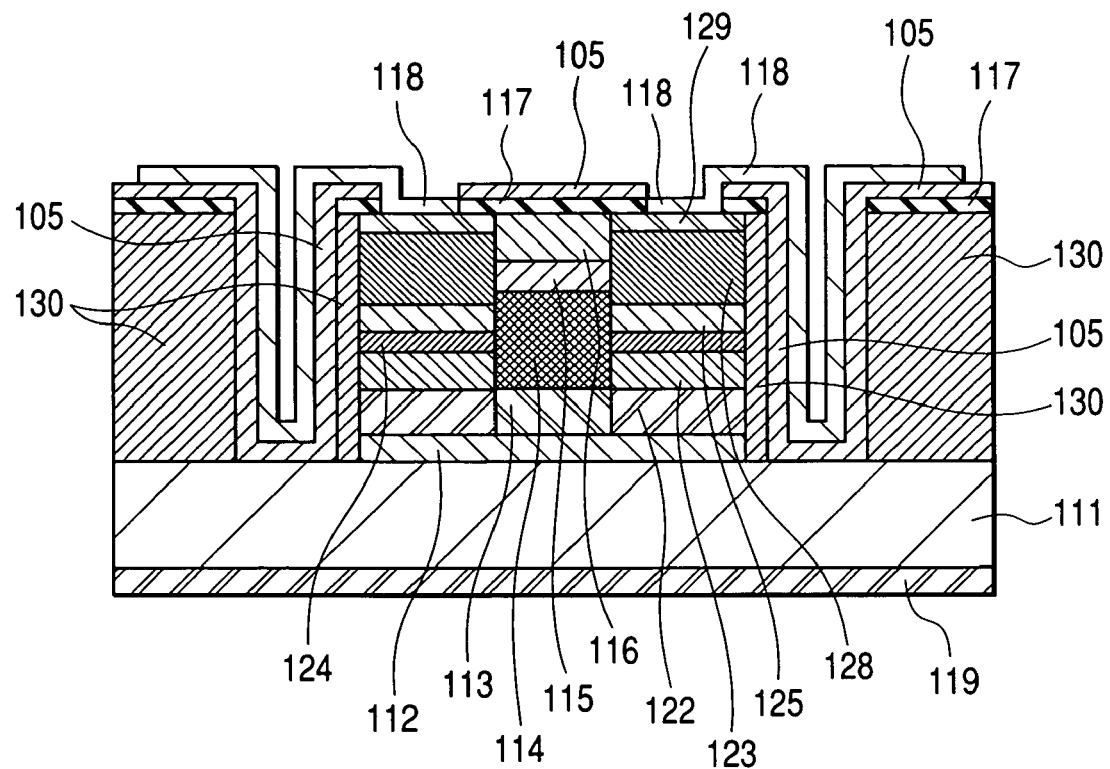
FIG. 7 is a cross-sectional view of the semiconductor optical amplifier according to the second embodiment, taken along line 7—7 indicated in FIG. 6.
Figure 8:
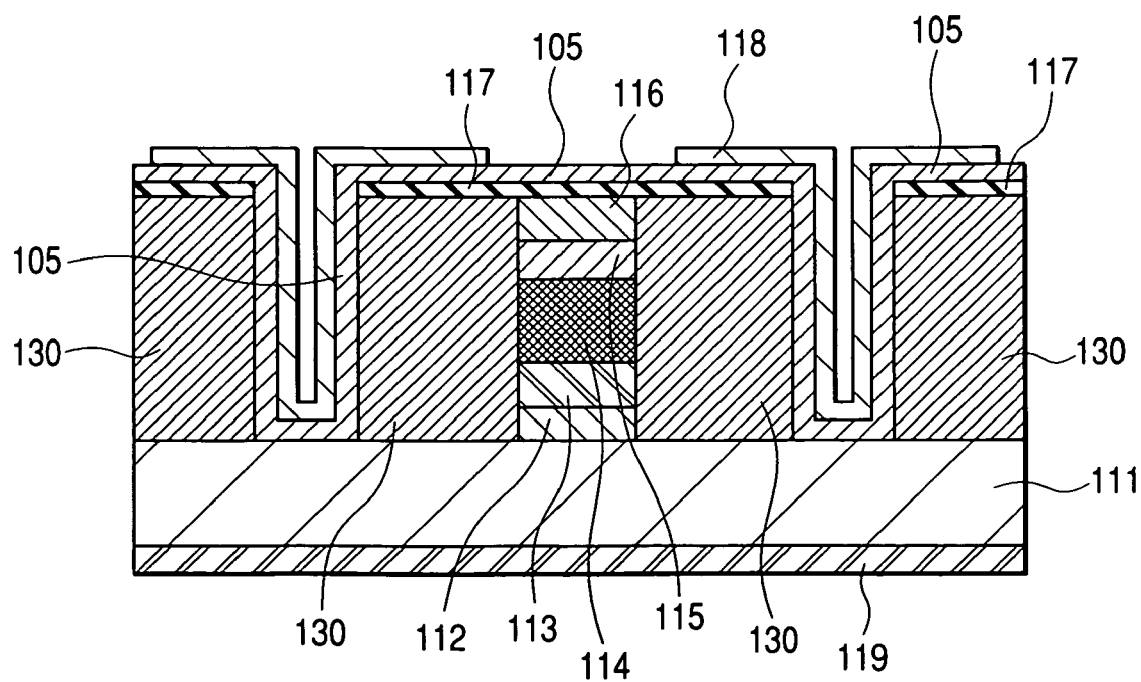
FIG. 8 is a cross-sectional view of the semiconductor optical amplifier according to the second embodiment, cut along line 8—8 indicated in FIG. 6.

With reference to FIG. 6 through FIG. 8, the following describes an optical amplifier having a plurality of lasing cavity structures according to a second embodiment. FIG. 6 shows a top view of this optical amplifier. FIG. 7 shows a section taken along line 7—7 indicated in FIG. 6. FIG. 8 shows a section taken along line 8—8 indicated in FIG. 6.

From the left side, an optical signal 170 enters an optical waveguide 101 shown in the center of the figure. The optical signal is amplified as it passes through a plurality of separate lasing cavities, and emitted as output light 171 from the right side of the optical waveguide.

Each of the plural optical waveguide region for lasing cavities is shown as a shaded part 102 in FIG. 6. Several methods can be used to form the plurality of separate lasing cavities. One of the methods is described below as an example. That is, after a multi-layered structure is formed, the structure is partitioned into separate ones by forming grooves. The same layer as for the optical signal propagation waveguide part is buried later in these grooves by epitaxial growth. These separating regions may also be left as grooves between ridges. In this case, the separating grooves are only passivated internally with a protection film after they are formed.

In the figures, 101 denotes the optical waveguide for the optical signal, 103 is an electrode pad, 104 is an antireflection coating formed on each end surface of the optical signal propagation waveguide and 105 is a coating for the lasing cavities.

In this embodiment, the crystal facets to constitute the lasing cavities are obtained by dry etching. They may also be obtained by cleaving, a common method. As for the multi-layered structure constituting the optical signal propagation waveguide, the multi-layered structure constituting the lasing cavities and the electrodes, their detailed description is omitted here since they are identical to those in the first embodiment.

As mentioned earlier, FIG. 7 shows a section which includes the signal waveguide part 7 and the laser part whereas FIG. 8 shows a section which includes the signal waveguide part but not the laser part. Separation into plural lasing cavities is made in order to narrow the width of each lasing cavity. This stabilizes the transverse mode and thereby raises the laser part's linearity of the relation between the bias current and the pumping optical power.

The gain characteristic of this semiconductor amplifier according to the present invention was measured. An optical signal is input to the semiconductor amplifier which was set on a sub-mount and aligned with lenses and fibers. Similar to the characteristic shown in FIG. 5, it is verified that the gain is saturated. It is also verified that the gain is free from polarization dependency thanks to the substantially square cross section of the optical waveguide which propagates the optical signal.

Further, advantages are brought about by the structural separation of the lasing optical waveguide from the optical signal propagation waveguide. That is, since no current is injected into the optical signal propagation waveguide, spectrum broadening due to spontaneous emission can be suppressed, which results in a lower level of noise. In addition, since the cladding layers in the optical signal propagation waveguide are not doped in this optical amplifier, loss due to impurities in the optical waveguide can be prevented.

In addition, since an optical waveguide structure, instead of a surface emission structure, is employed as the cavity structure to generate pumping laser light, it is possible to raise the intensity of the pumping light.

<Embodiment 3>

Figure 9:
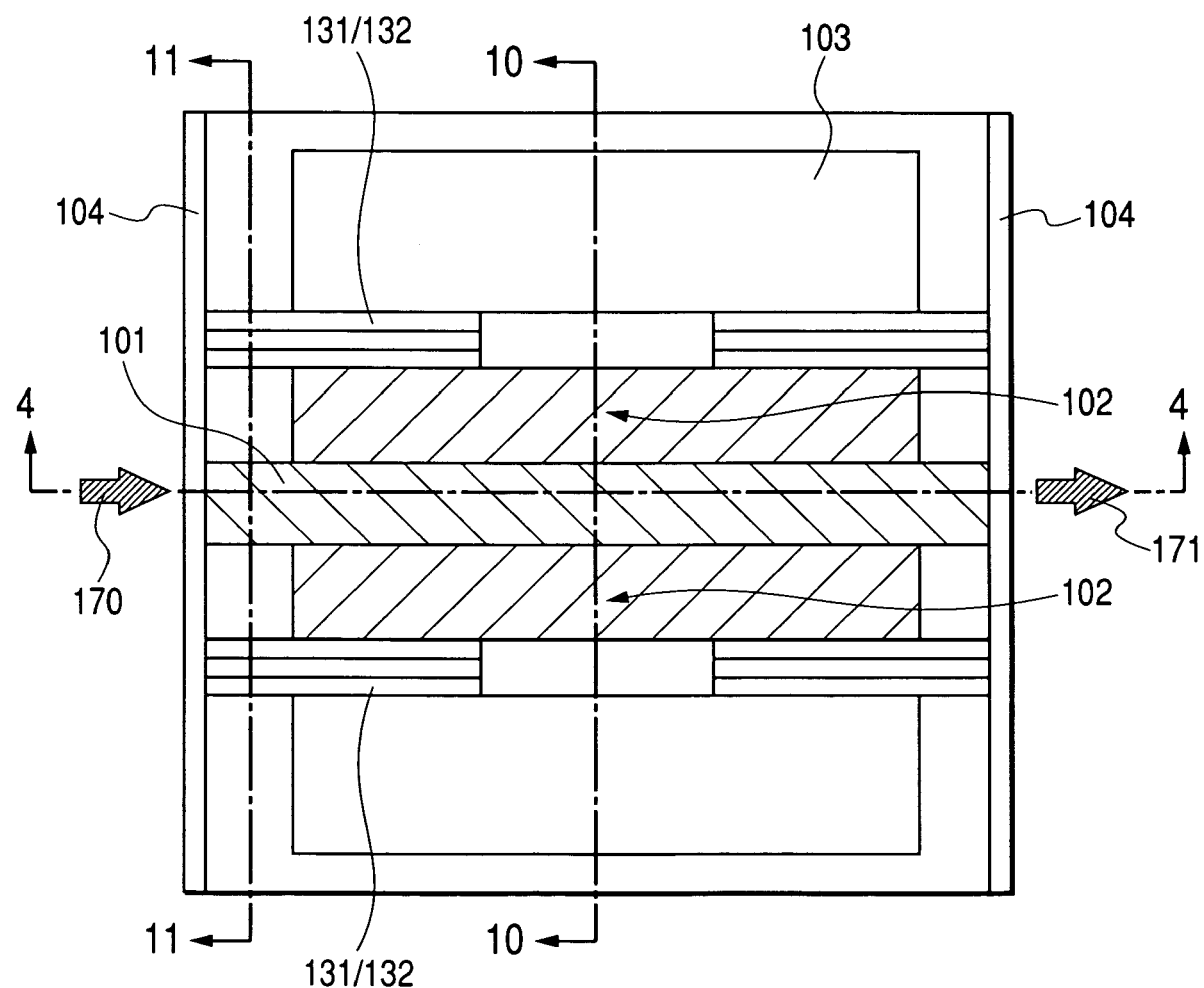
FIG. 9 is a top view of a semiconductor optical amplifier according to a third embodiment of the present invention.
Figure 10:
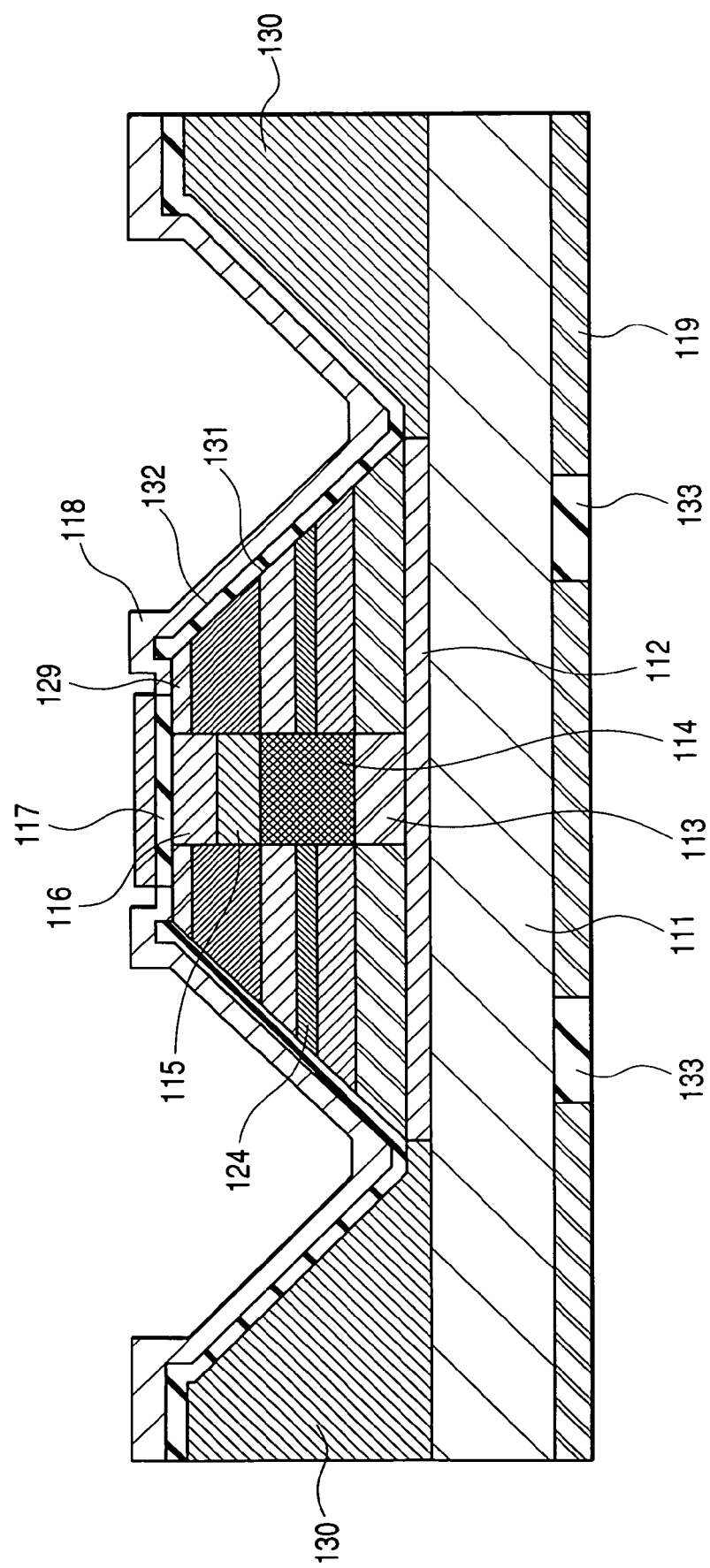
FIG. 10 is a cross-sectional view of the semiconductor optical amplifier according to the third embodiment, taken along line 10—10 indicated in FIG. 9.
Figure 11:
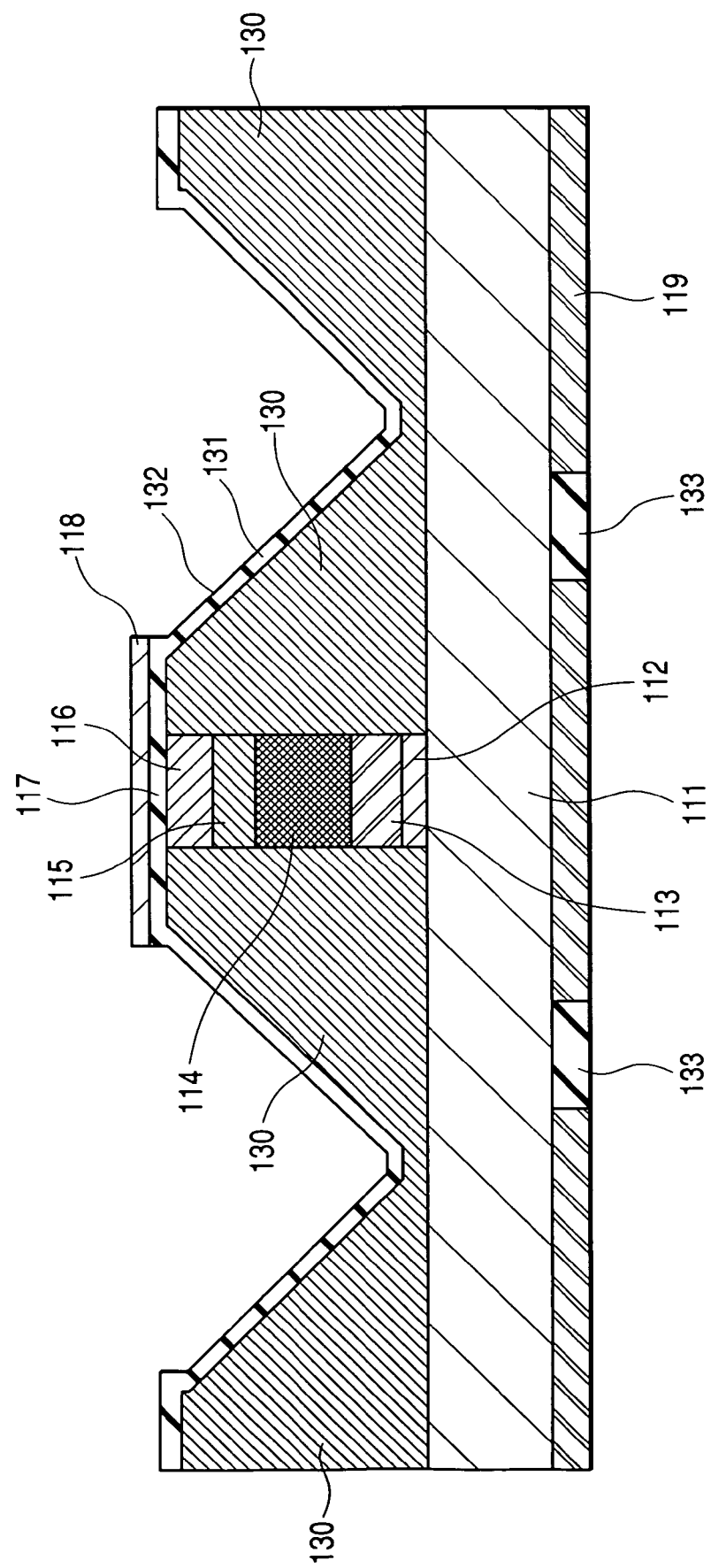
FIG. 11 is a cross-sectional view of the semiconductor optical amplifier according to the third embodiment, taken along line 11—11 indicated in FIG. 9.

In a third embodiment, 45-degree reflecting mirrors are used for an optical amplifier. That is, a lasing cavity to generate pumping light used to amplify the optical signal is constituted by multi-layered dielectric films and an optical waveguide formed on the bottom side of the substrate and two 45-degree reflecting mirrors on the top side of the substrate. This embodiment is described with reference to FIG. 9 through FIG. 11. FIG. 9 is a top view of this optical amplifier. FIG. 10 shows a section taken along line 10—10 indicated in FIG. 9, that is, this figure shows a section which includes the lasing cavity part. FIG. 11 shows a section taken along line 11—11. The longitudinal section of the optical signal propagation waveguide part, taken along line 4—4, is the same as shown in FIG. 4. The multi-layered structures which respectively constitute the optical signal propagation waveguide part and the lasing cavity part are identical to those in the first embodiment.

Referring to FIG. 9, an optical signal 170 enters an optical waveguide 101 from the left entrance. The optical signal 170 is amplified as it passes through the lasing cavity, and emitted as output light 171 from the right side of the optical waveguide. In the figure, 101 denotes the optical waveguide for the optical signal, 103 is an electrode pad formed on the bottom side, 104 is an antireflection coating formed on each facet of the optical signal propagation waveguide and 131 is a 45-degree mirror part. Each 45-degree mirror part 131 is formed by wet-etching the semiconductor multi-layered structure at 45 degrees to the substrate and depositing a high reflectance dielectric film 132 on the obtained 45-degree surface. This is because numerals 131/132 are used in the figure to denote the relevant regions. High reflection dielectric films 133 are formed on the bottom side of the substrate by mirror finish etching treatment. The thus formed two 45-degree mirror parts 131, the semiconductor multi-layered structure and the reflection parts 133 of the substrate bottom constitute an optical cavity.

Figure 12:
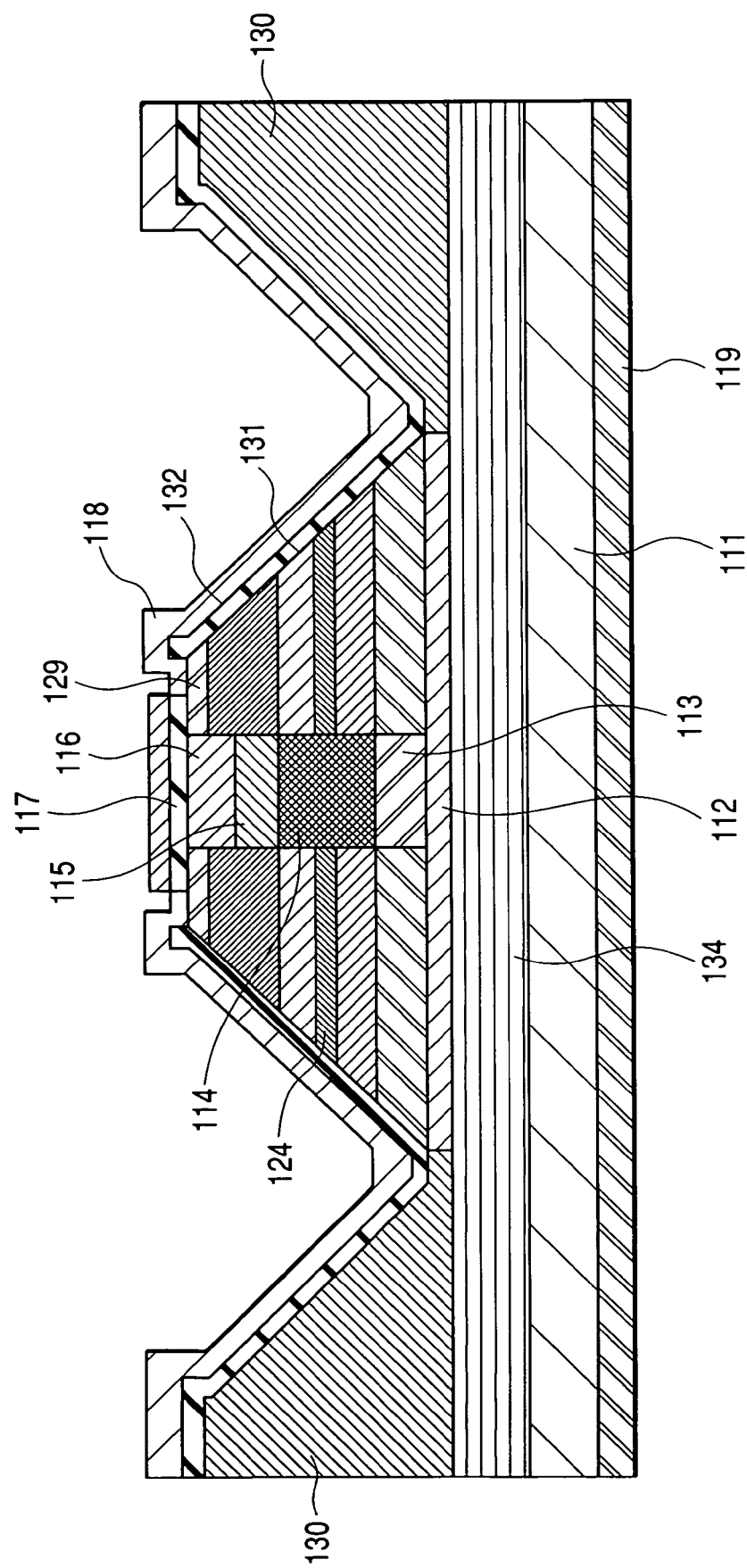
FIG. 12 is a cross-sectional view of another semiconductor optical amplifier according to the third embodiment, taken along line 10—10 indicated in FIG. 9.
Figure 13:
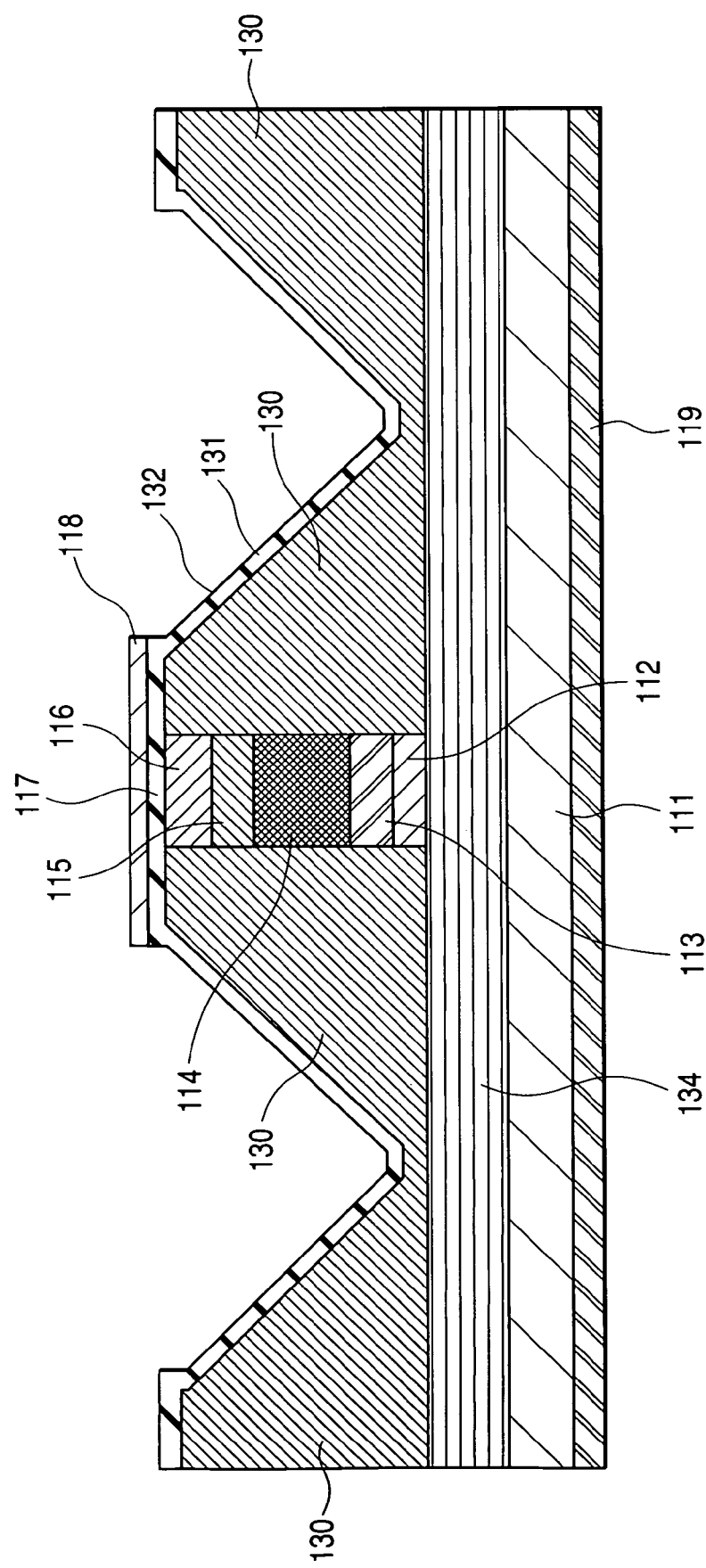
FIG. 13 is a cross-sectional view of another semiconductor optical amplifier according to the third embodiment, taken along line 11—11 indicated in FIG. 9.

FIG. 12 shows a section of a modification of the third embodiment. In this modification, the reflector parts 133 are formed as a semiconductor multi-layered reflector film 134 on the substrate 111. The n-type semiconductor multi-layered reflector film is formed before the n-type cladding layer 113 is deposited above. This eliminates the necessity of forming reflector parts on the bottom side of the substrate. Either InGaAsP/InP or GaAs/InAs may be used to form the semiconductor multi-layered reflector film.

The largest structural advantage of this embodiment is that the lasing cavity can be formed without using such advanced techniques as deposition of a multi-layered dielectric reflector film on a perpendicular surface formed by dry etching.

The gain characteristic of the third semiconductor amplifier embodiment according to the present invention was measured. An optical signal is input to the semiconductor amplifier which was set on a sub-mount and aligned with lenses and fibers. Similar to the characteristic shown in FIG. 5, it is verified that the gain is saturated. It is also verified that the gain is free from polarization dependency thanks to the substantially square cross section of the optical waveguide which propagates the optical signal.

Further, advantages are brought about by the structural separation of the lasing optical waveguide from the optical signal propagation waveguide. Namely, since no current is injected into the optical signal propagation waveguide, spectrum broadening due to spontaneous emission can be suppressed, which results in a lower level of noise. In addition, since the cladding layers in the optical signal propagation waveguide are not doped in this optical amplifier, loss due to impurities in the optical waveguide can be prevented.

In addition, since an optical waveguide structure, instead of a surface emission structure, is employed as the cavity structure to generate pumping laser light, it is possible to raise the intensity of the pumping light.

<Embodiment 4>

Figure 14:
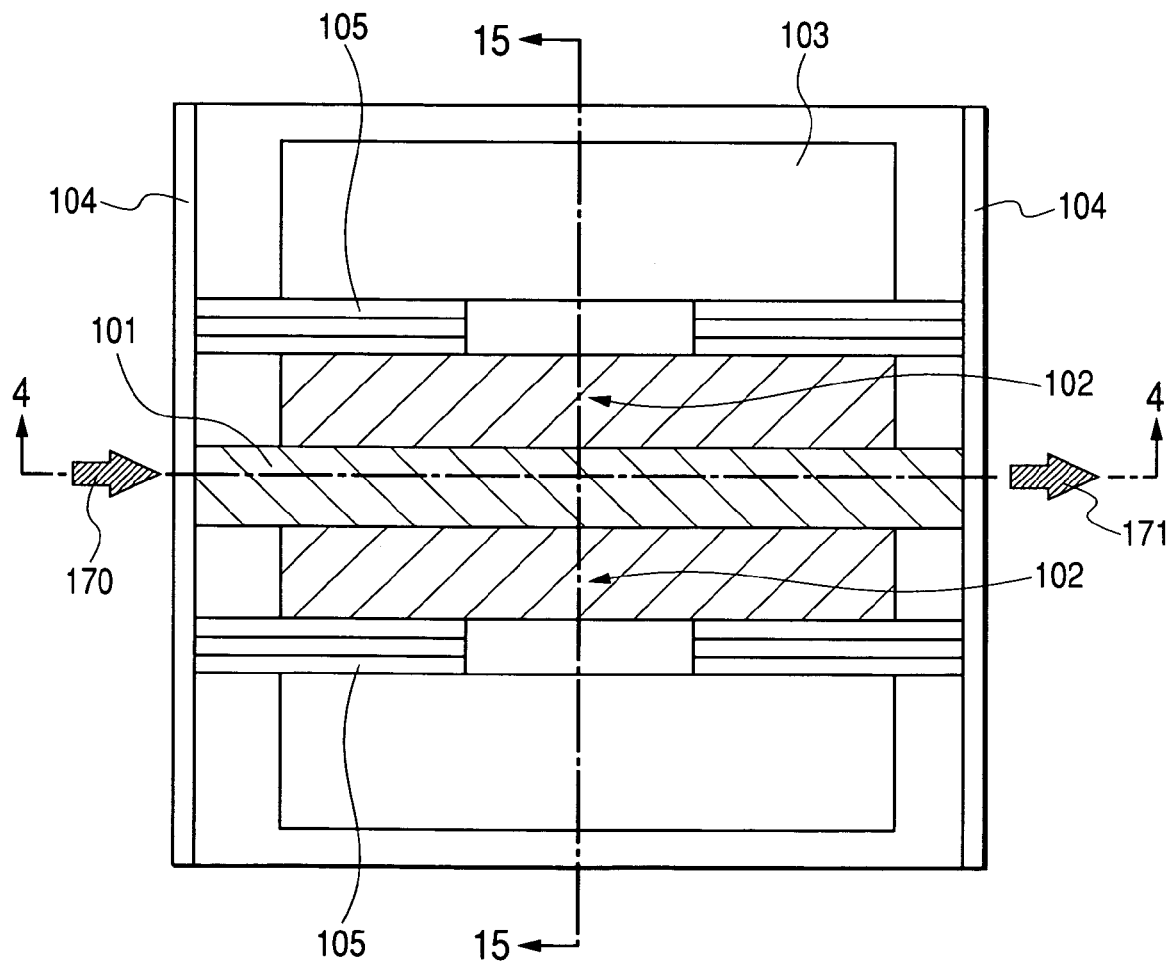
FIG. 14 is a top view of a semiconductor optical amplifier according to a fourth embodiment of the present invention.
Figure 15:
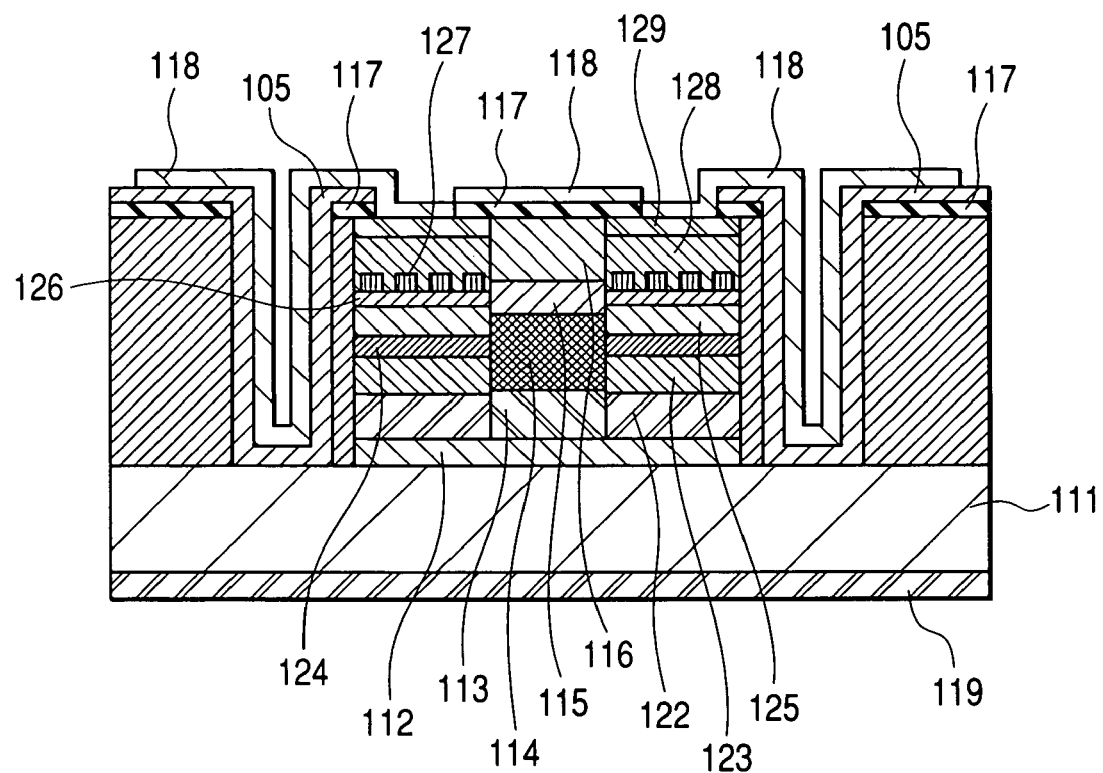
FIG. 15 is a cross-sectional view of the semiconductor optical amplifier according to the fourth embodiment, taken along line 15—15 indicated in FIG. 14.
Figure 16:
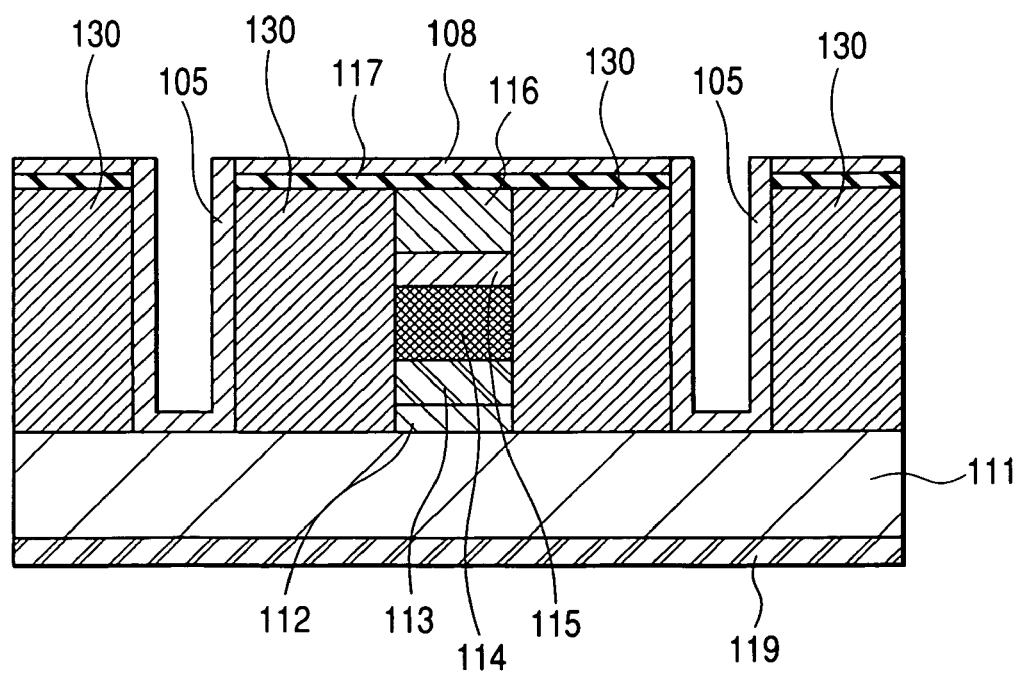
FIG. 16 shows a cross-sectional view of the semiconductor optical amplifier according to the fourth embodiment, taken along line 16—16 indicated in FIG. 14.

In a fourth embodiment, a grating is formed in an optical waveguide part which constitutes a lasing cavity used to amplify an optical signal. This embodiment is described with reference to FIG. 14 through and FIG. 16. FIG. 14 is a top view of this optical amplifier. FIG. 15 shows a section of the optical signal propagation waveguide part taken along line 15—15 indicated in FIG. 14. FIG. 16 shows a section of the lasing cavity part taken along line 16—16 indicated in FIG. 14. The multi-layered structure of the optical signal propagation waveguide part is basically identical to that in the first embodiment.

From the left side, an optical signal 170 is input to an optical waveguide 101 shown in the center of the figure. The optical signal 170 is amplified as it passes through an optical waveguide region for lasing 102, and is output as output light 171 from the right side of the optical waveguide 101. In the figure, reference numeral 101 denotes an optical waveguide for the optical signal, 102 is an optical waveguide region for lasing, 103 is a bottom electrode pad, 104 is an antireflection coating formed on each facet of the optical signal waveguide, and 105 is a coating for the lasing cavity.

In the lasing cavity of this embodiment, a grating 127 is formed between an SCH (Separate Confining Heterostructure) layer 125 and a cladding layer 128 in order to select a longitudinal mode. In addition, the crystal facets to constitute the lasing cavity are obtained by dry etching although they may also be obtained by cleaving. Although the grating 127 enables lasing, these reflecting facets are used effectively to confine laser light in the chip and thereby raise the efficiency.

FIG. 15 shows a section of the lasing cavity part. As shown, the laser part is a multi-layered structure formed by stacking on an InP substrate 111 an InP buffer layer (n-type, $1\times10^{18}$ cm$^{-3}$, thickness 0.15 μm) 112, an InGaAsP cladding layer (n-type, $5\times10^{17}$ cm$^{-3}$, thickness 0.2 μm, ëg=1.05 μm) 122, an InGaAsP SCH layer (n-type, $1\times10^{17}$ cm$^{-3}$, thickness 0.1 μm, ëg=1.15 μm) 123, an InGaAsP MQW active layer (none-dope, well layer thickness 10 nm/ëg=1.55 μm, barrier layer thickness 10 nm/ëg=1.3 μm, 10 periods) 124, an InGaAsP SCH layer (p-type, $1\times10^{17}$ cm$^{-3}$, thickness 0.1 μm) 125, an InP spacer layer (p-type, $5\times10^{17}$ cm$^{31\ 3}$, thickness 0.2 μm) 126, an InGaAsP grating layer (p-type, $5\times10^{18}$ cm$^{-3}$, thickness 0.05 μm) 127, an InP cladding layer (p-type, $1\times10^{17}$ cm$^{-3}$, thickness 1.5 μm) 128, an InGaAs contact layer (p-type, $2\times10^{19}$ cm$^{-3}$, thickness 0.1 μm) 129, an insulation film (SiN, thickness 0.5 μm) 117 and a p electrode (Ti/Pt/Au) 118 on the InP substrate 111. Further, an n-electrode (Ni/AuGe/Au) 119 is formed on the bottom of the substrate 111. The grating is formed by electron beam lithography.

The gain characteristic of this semiconductor amplifier according to the present invention was measured. An optical signal is input to the semiconductor amplifier which was set on a sub-mount and aligned with lenses and fibers. Similar to the characteristic shown in FIG. 5, it is verified that the gain is saturated. It is also verified that the gain is free from polarization dependency thanks to the substantially square cross section of the optical waveguide which propagates the optical signal.

Further, advantages are brought about by the structural separation of the lasing optical waveguide from the optical signal propagation waveguide. That is, since no current is injected into the optical signal propagation waveguide, spectrum broadening due to spontaneous emission can be suppressed, which results in a lower level of noise. In addition, since the cladding layers in the optical signal propagation waveguide are not doped in this optical amplifier, loss due to impurities in the optical waveguide can be prevented.

In addition, since an optical waveguide structure, instead of a surface emission structure, is employed as the cavity structure to generate pumping laser light, it is possible to raise the intensity of the pumping light.

<Embodiment 5>

Figure 18:
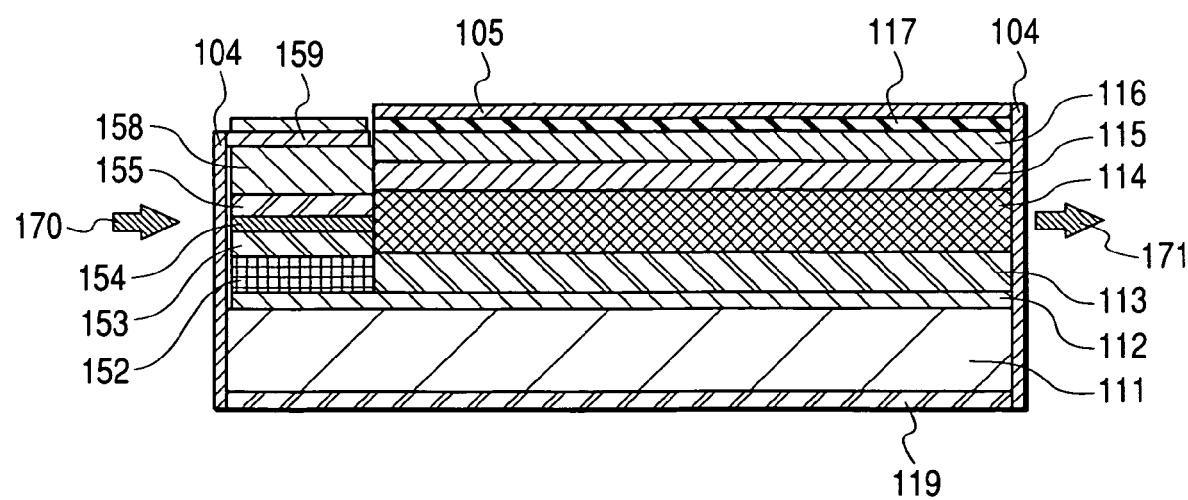
FIG. 18 is a cross-sectional view of the semiconductor optical amplifier according to the fifth embodiment in which a variable attenuator is integrated at the input end of the semiconductor optical amplification section, taken along line 18—18 indicated in FIG. 17.

With reference to FIGS. 17 and 18, the following describes a fifth embodiment having a variable optical attenuator integrated to the entrance of the optical signal propagation waveguide. FIG. 17 is a top view of this optical amplifier while FIG. 18 shows a section taken along line 18—18 indicated in FIG. 17 parallel to the propagating direction of light. From the left side, an optical signal 170 enters a variable optical attenuator 106 through which the optical power level is adjusted. Then the optical signal enters the optical waveguide of the optical amplifier 107 and is amplified as it passes through the optical waveguide region for lasing 102. The amplified optical signal is emitted as output light 171 from the right side of the optical waveguide. When plural optical signals having different levels of optical power are treated in parallel, it is possible to make the output signals uniform in power by adjusting the input power levels to the same level.

FIG. 18 shows a section of the variable optical attenuator. Its multi-layered structure is formed by stacking an InP buffer layer (n-type, 1×10.sup.18 cm$^{-3}$, thickness 0.15 μm) 112, an InGaAsP buffer layer (n-type, $5\times10^{17}$ cm$^{-3}$, thickness 0.2 μm, ëg=1.05 μm) 152, an InGaAsP SCH layer (n-type, $1\times10^{17}$ cm$^{-3}$ thickness 0.2 μm, ëg=1.15 μm) 153, an InGaAsP MQW active layer (none-dope, well layer thickness 8 nm/ëg=1.52 μm, barrier layer thickness 12 nm/ëg=1.3 μm, 10 periods) 154, an InGaAsP SCH layer (none-dope, thickness 0.2 μm, ëg=1.10 μm) 155, an InP cladding layer (p-type, $1\times10^{18}$ cm$^{-3}$, thickness 1.5 μm) 158, an InGaAsP contact layer (p-type, $2\times10^{19}$ cm$^{-3}$, thickness 0.1 μm) 159, an insulation film (SiN, thickness 0.5 μm) 117 and a p electrode (Ti/Pt/Au) 118 on the InP substrate 111. On the bottom of the substrate 111, an n-electrode (Ni/AuGe/Au) 119 is formed.

Figure 19:
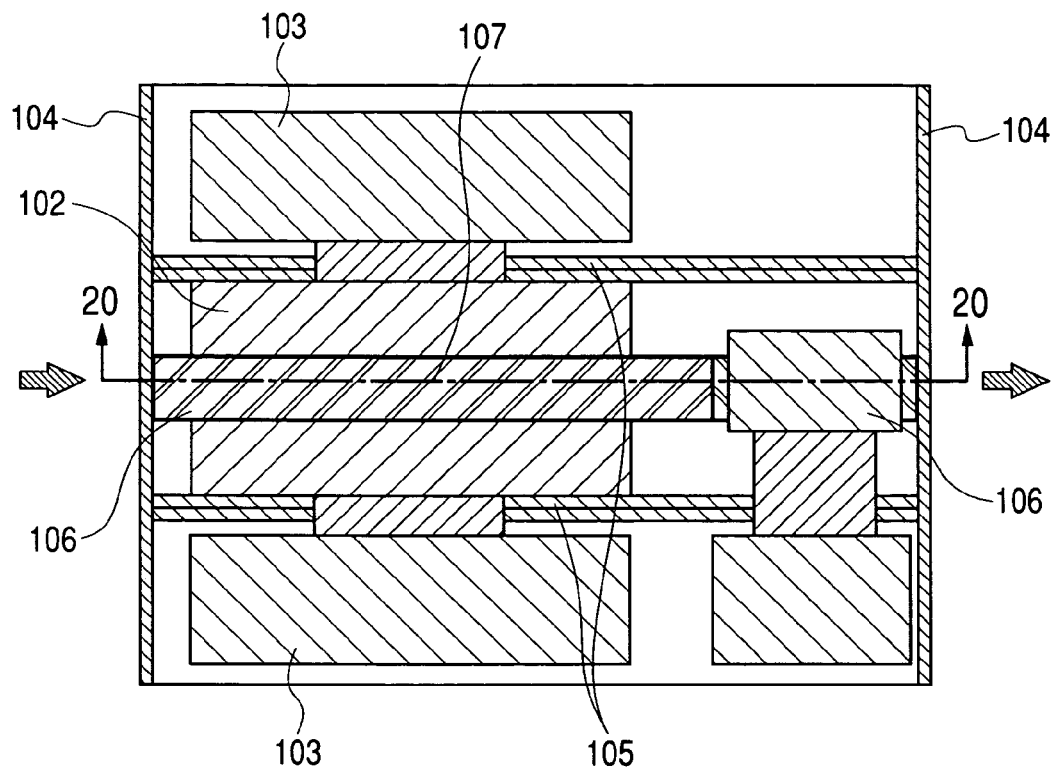
FIG. 19 is a top view of another semiconductor optical amplifier in which a variable attenuator is integrated at the output end of the semiconductor optical amplification section, according to the fifth embodiment of the present invention.

FIGS. 19 and 20 show an embodiment having a variable attenuator integrated at the exit. FIG. 19 is its top view while FIG. 20 shows a section. It has the same structure as the above-mentioned embodiment except that a variable attenuator 106 is formed at the exit. The region of the variable attenuator 106 is substantially the same as the variable optical attenuator in FIG. 18. The power level of the optical signal 170 amplified by the semiconductor amplifier can be adjusted to an appropriate level by the variable attenuator at the exit. Therefore, when plural optical signals having different levels of power are treated in parallel, it is possible, for example, to make the individual power levels uniform at the exit. It is also possible to cut off the signals of specific channels.

Further, if a high-speed variable attenuator, namely, an EA modulator is integrated at the exit in the semiconductor optical amplifier, it is possible to generate a large amplitude optical signal by amplifying CW (Continuous Wave) light.

<Embodiment 6>

Figure 22:
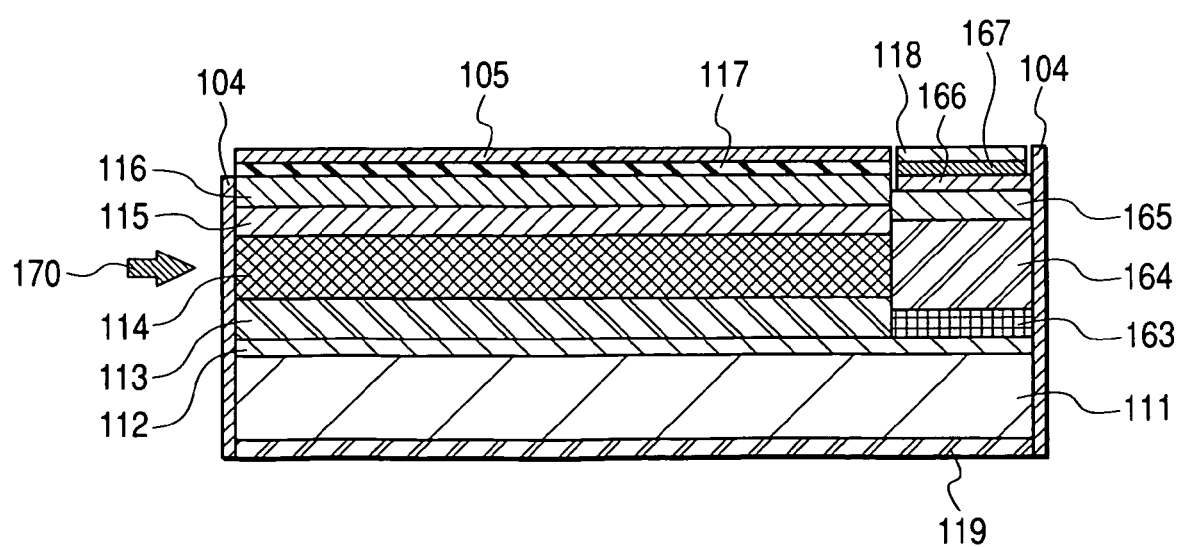
FIG. 22 shows a cross-sectional view of the semiconductor optical amplifier according to the sixth embodiment in which a photo acceptance element is integrated, taken along 22—22 indicated in FIG. 21.

In a sixth embodiment, a photo acceptance element is integrated at the exit of the optical waveguide which propagates the optical signal. FIG. 21 is a top view thereof. FIG. 22 shows a section thereof taken along line 22—22 of FIG. 21 parallel to the propagating direction of light. The optical signal 170 enters the optical waveguide of the optical amplifier 107 from the left side and is amplified as it passes through the optical waveguide region for lasing 102. Then, the amplified optical signal enters the photo acceptance element 108 integrated at the right end of the optical waveguide 107 and is converted to an electrical signal. Thanks to amplification by the optical amplifier, even a subtle optical signal can be amplified to exceed the minimum level sensible by the photo acceptance element.

FIG. 22 shows the multi-layered structure of the photo acceptance element. On the InP substrate 111, stacked are an InP buffer layer (n-type, $1\times10^{18}$ cm$^{-3}$, 0.15 μm) 112, an InGaAsP cladding layer (n-type, none-dope, $1\times10^{17}$ cm$^{-3}$, thickness 0.5 μm, ëg=1.15 μm) 163, an InGaAs absorption layer (none-dope, thickness 1.5 μm) 164, an InGaAsP cladding layer (p-type, $1\times10^{17}$ cm$^{-3}$, thickness 0.2 μm, ëg=1.15 μm) 165, an InGaAsP cap layer (p-type, $1\times10^{18}$ cm$^{-3}$, thickness 0.2 μm) 166, an InGaAs contact layer (p-type, $2\times10^{19}$ cm$^{-3}$, thickness 0.1 μm) 167, an insulating film (SiN, thickness 0.5 μm) 117 and a p-electrode (Ti/Pt/Au). On the bottom of the substrate 111, an n-electrode (Ni/AuGe/Au) 119 is formed.

Figure 23:
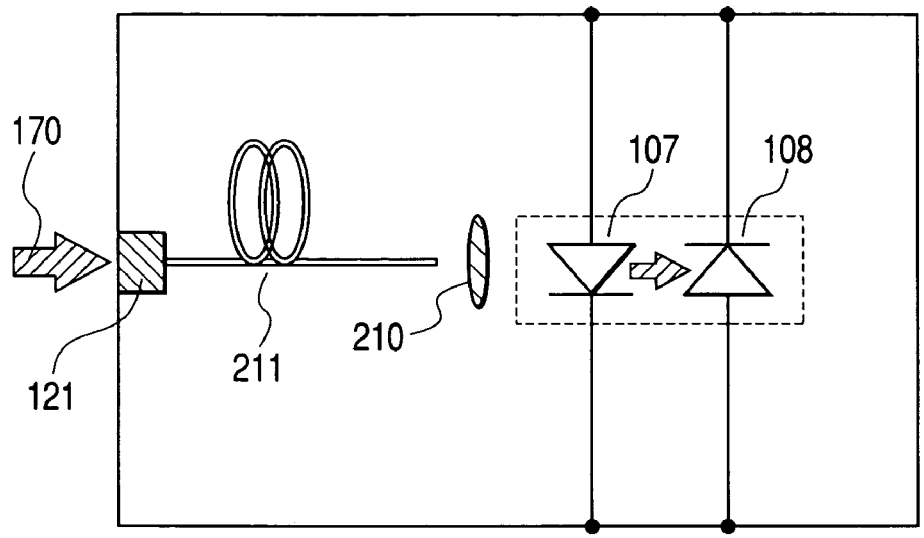
FIG. 23 schematically shows the configuration of a module using the semiconductor optical amplifier according to the sixth embodiment of the present invention in which a photo acceptance is integrated.
Figure 24:
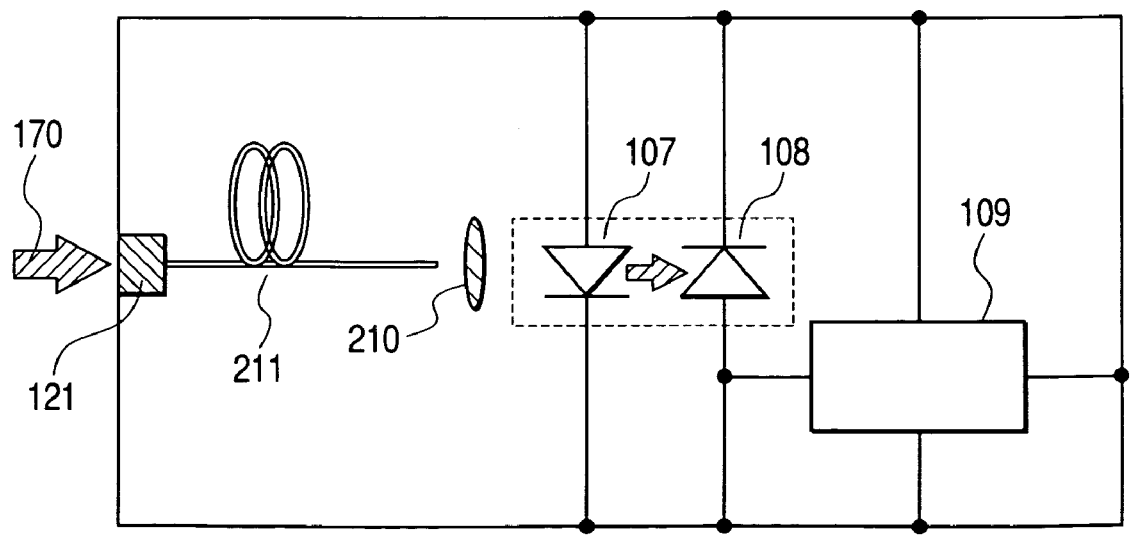
FIG. 24 schematically shows the configuration of another module using the semiconductor optical amplifier according to the sixth embodiment of the present invention in which a photo acceptance is integrated.

FIG. 23 shows an example of an optical reception module configuration in which a semiconductor optical amplifier incorporating a photo acceptance element is combined with a lens 210 and an optical fiber 211. FIG. 24 shows an example of an optical reception module configuration in which the semiconductor optical amplifier is further combined with a preamplifier 109. In FIG. 23, the optical signal 170 is introduced into the optical fiber 211 from the entrance 121 of the optical reception module. The optical signal is converged into the optical amplification part of the semiconductor optical amplifier 107 through the lens 210. Further, the output from the optical amplification part is input to the photo acceptance element 108, namely such as a PIN photodiode. Then, the signal is taken out from the photo acceptance element 108 as an electrical signal. The optical reception module in FIG. 24 is identical to that in FIG. 23 except that the preamplifier 109 is provided for the electrical output from the photo acceptance element 108. Note that each black circle in the figures means an electrical connection or a terminal.

Figure 25:
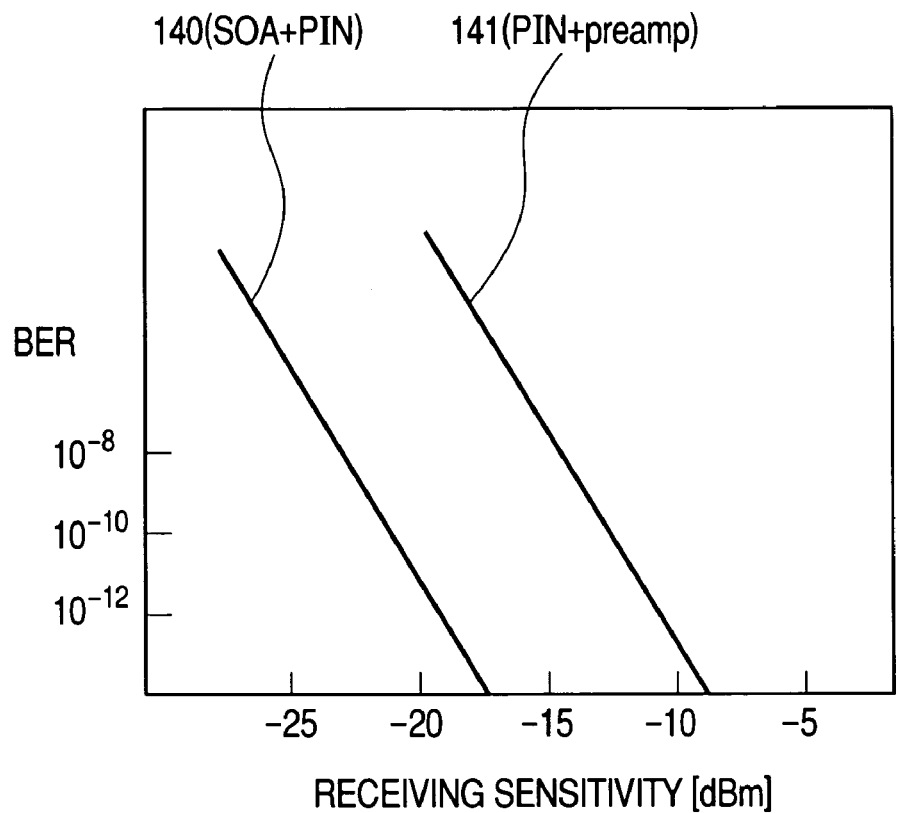
FIG. 25 shows an example of characteristic, as a reception module, of the semiconductor optical amplifier according to the sixth embodiment in which a photo acceptance is integrated.

In such an embodiment, the semiconductor optical amplifier can amplify a subtle optical signal which cannot be received by an ordinary reception module consisting merely of a photo acceptance device and a preamplifier. Therefore, it is possible to provide raised total reception performance as a reception module. An example of the total reception performance as a reception module is shown in FIG. 25. The horizontal axis represents the receiving sensitivity while the vertical axis represents the BER. A characteristic 140 is that of a reception module having a SOA (Semiconductor Optical Amplifier) and a PIN photodiode in accordance with the present invention while a characteristic 141 is that of a reception module having a PIN photodiode and a preamplifier with no SOA. According to these examples of characteristics, 10 dB or more improvement is obtained if a semiconductor optical amplifier is included, making it possible to attain a high level of reception performance comparable to that obtained by using an APD. Therefore, these reception modules in accordance with the present invention shows the effect of integration particularly in higher-than-10 Gbps applications where high level packaging technology is required.

<Embodiment 7>

Figure 26:
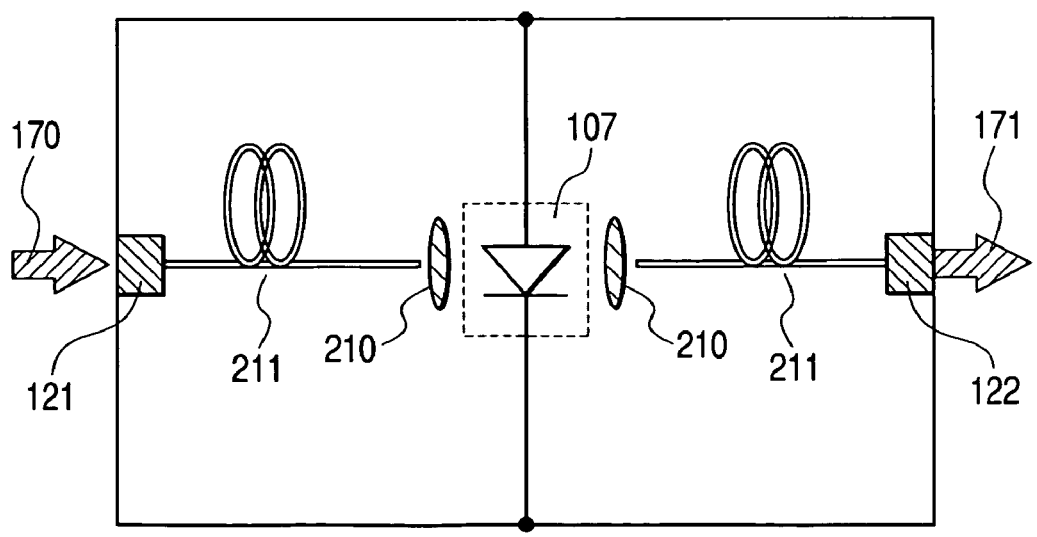
FIG. 26 shows the configuration of a semiconductor optical amplifier module according to a seventh embodiment of the present invention.

FIG. 26 shows an example of a module configured by combining one of the semiconductor optical amplifiers of the first to fourth embodiments with a lens 210, a fiber 211 and a Peltier device 212. This configuration makes it possible to manufacture a gain saturated, low coupling loss module. Note that identical reference numerals are used to designate those identical to their corresponding ones in FIGS. 23 and 24. Reference numeral 122 designates the output terminal.

Figure 27:
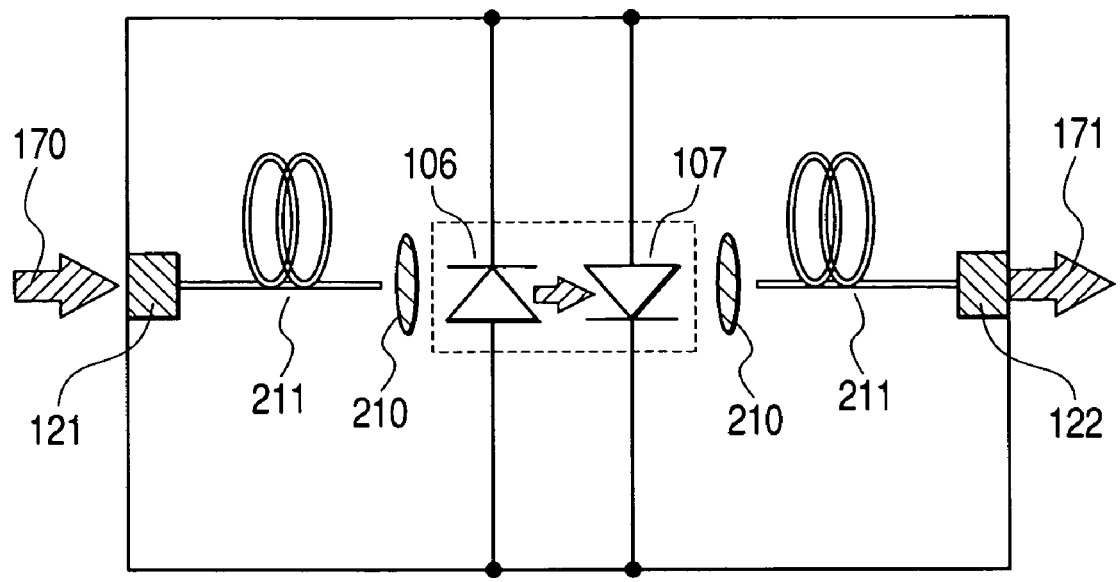
FIG. 27 shows another configuration of a semiconductor optical amplifier module according to the seventh embodiment of the present invention.
Figure 28:
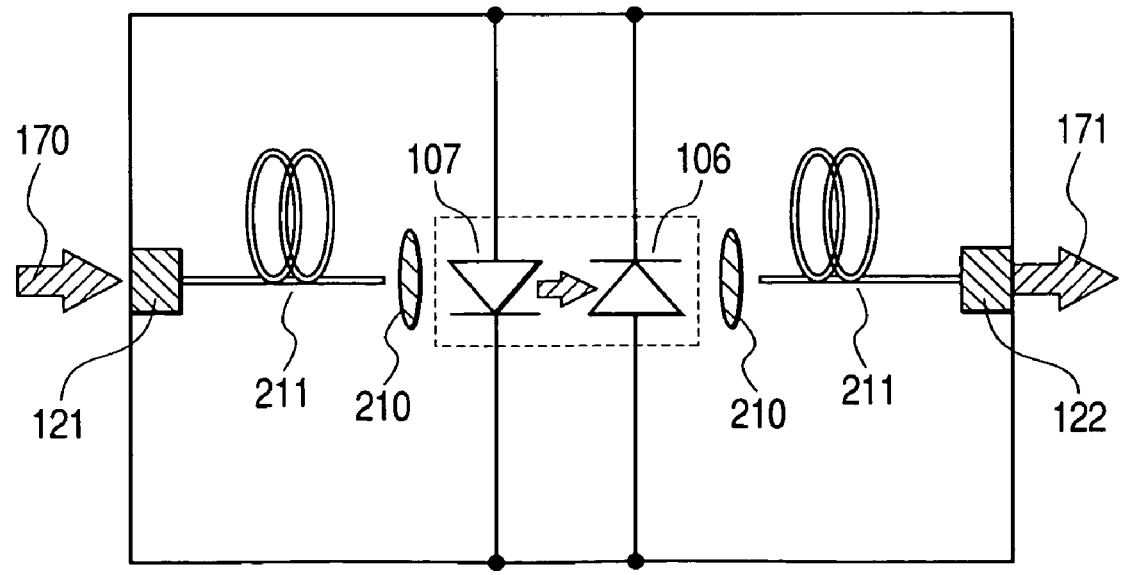
FIG. 28 shows another configuration of a semiconductor optical amplifier module according to the seventh embodiment of the present invention.

In the module of FIG. 27, a variable attenuator-integrated semiconductor optical amplifier is combined with a control switch. The module in FIG. 28 has an EA modulator-integrated semiconductor optical amplifier combined with a driver IC. Including them, a variety of alterations and configurations are possible. Accordingly, by use of such a chip device where needed electrical and/or optical elements are integrated on a substrate, it is possible to provide a low packaging cost, low coupling loss tunable semiconductor amplifier module.

Note that although InGaAsP, InGaAs and InP are used as layered crystals in the first through seventh embodiments, other crystal systems such as InAlGaAs and InAlAs can also be used as layered crystals. Needless to say, it is also possible to freely determine the types (p-type or n-type) of the substrate and each layer and the densities of impurities therein as needed by the application.

Problems with prior art semiconductor optical amplifiers are that gain shows polarization dependency and is not saturated and integrating a surface emitting laser in an optical amplifier in order to saturate the gain results in higher cost due to long epitaxial growth time. As described so far based on various embodiments, the present invention solves these problems by forming a structurally separate lasing optical waveguide in the same plane as but not in parallel to the optical signal propagation waveguide. The present invention makes it possible to provide an inexpensive, gain-saturated, polarization dependency-free high-function semiconductor optical amplifier/module. Industrially, the present invention has great importance.

Major embodiments of the present invention are summarized and listed as follows:

(1) A semiconductor optical amplifier comprising an optical waveguide which propagates an input optical signal and having a function to amplify the signal, wherein the optical signal is amplified by stimulating emission in the optical waveguide with carriers which are pumped fully optically.

(2) A semiconductor optical amplifier according to Paragraph (1), wherein: an optical waveguide/cavity structure is formed in the same plane but not parallel to the optical waveguide which propagates the input optical signal; and the optical signal is amplified by stimulating emission in the optical waveguide with carriers pumped by laser light which is generated by the lasing optical waveguide/cavity structure and goes across a part or the whole of the optical wavelength.

(3) A semiconductor optical amplifier wherein: as stated in Paragraph (2), an optical waveguide/cavity structure is formed in the same plane but not parallel to the optical waveguide which propagates the input optical signal; as stated in Paragraph (2), the optical signal is amplified by stimulating emission in the optical waveguide with carriers pumped by laser light which is generated by the lasing optical waveguide/cavity structure and goes across a part or the whole of the optical wavelength; and the lasing optical waveguide/cavity structure is separated into a plurality of optical waveguide/cavity units.

(4) A semiconductor optical amplifier according to Paragraph (2) or (3) wherein the optical reflectors to constitute the lasing cavity structure used to amplify the optical signal is obtained by depositing a dielectric multi-layered film on facets formed by dry etching.

(5) A semiconductor optical amplifier according to Paragraph (2) or (3) wherein the optical reflectors to constitute the lasing cavity structure used to amplify the optical signal is obtained by depositing a dielectric multi-layered film on facets formed by cleaving.

(6) A semiconductor optical amplifier according to Paragraph (2) or (3) wherein the optical reflectors to constitute the lasing cavity structure used to amplify the optical signal are dielectric multi-layered films formed on the bottom side of the substrate and two 45-degree reflector mirrors formed on the same side of the substrate as the optical waveguide.

(7) A semiconductor optical amplifier according to Paragraph (2) or (3) wherein the optical reflectors to constitute the lasing cavity structure used to amplify the optical signal are semiconductor multi-layered films formed by epitaxial growth and two 45-degree reflector mirrors formed on the same side of the substrate as the optical waveguide.

(8) A semiconductor optical amplifier according to any of Paragraphs (1) through (7) wherein a grating is formed in an optical waveguide portion constituting a lasing cavity used to amplify the optical signal.

(9) A semiconductor optical amplifier according to any of Paragraphs (1) through (8) wherein a variable optical attenuator is integrated at the input end and/or output end of the optical waveguide which propagates the optical signal.

(10) A photo acceptance device with a built-in optical preamplifier, comprising a semiconductor optical amplifier according to any of Paragraphs (1) through (8), provided with a photo acceptance element integrated at the output end of the optical waveguide which propagates the optical signal.

(11) An optical amplifier module comprising a semiconductor optical amplifier according to any of Paragraphs (1) through (9) mounted therein.

(12) An optical reception module in which an photo acceptance device with a built-in optical preamplifier according to Paragraph (10) is mounted.

(13) A semiconductor optical amplifier, comprising:
a first optical waveguide which propagates an input optical signal; and
an optical amplification section, which amplifies the optical signal by causing stimulated emission with:
radiation incident on the first optical waveguide from the direction which is included in a plane parallel to the first optical waveguide and intersects the optical propagating direction of the first optical waveguide; or
a cavity structure formed in the direction which intersects the optical propagating direction of the first optical waveguide.

(14) A semiconductor optical amplifier according to Paragraph (13), wherein any gain medium to amplify light is not provided around the optical input surface of the first optical waveguide which propagates the input optical signal.

(15) A semiconductor optical amplifier according to Paragraph (13), wherein a part or the whole of the gain medium of the first optical waveguide which propagates the input optical signal is used also as a part or the whole of the gain medium of the optical amplification section which amplifies the optical signal.

(16) A semiconductor optical amplifier according to Paragraph (14), wherein a part or the whole of the gain medium of the first optical waveguide which propagates the input optical signal is used also as a part or the whole of the gain medium of the optical amplification section which amplifies the optical signal.

(17) A semiconductor optical amplifier according to Paragraph (15), wherein: a part or the whole of the gain medium of the first optical waveguide which propagates the input optical signal is used also as a part of the gain medium of the optical amplification section which amplifies the optical signal; or the gain medium used in the first optical waveguide is different in composition from the gain medium used in a portion which generates radiation incident on the first optical waveguide.

(18) A semiconductor optical amplifier according to Paragraph (16), wherein: a part or the whole of the gain medium of the first optical waveguide which propagates the input optical signal is used also as a part of the gain medium of the optical amplification section which amplifies the optical signal; or the gain medium used in the first optical waveguide is different in composition from the gain medium used in a portion which generates radiation incident on the first optical waveguide.

(19) A semiconductor optical amplifier according to Paragraph (13), wherein: a photonic crystal is provided along a side of the first optical waveguide which propagates the input optical signal; and with a cavity structure formed in the direction which intersects the optical propagating direction of the first optical waveguide, the optical signal is amplified by causing stimulated emission.

(20) A semiconductor optical amplifier according to Paragraph (14), wherein: a photonic crystal is provided along a side of the first optical waveguide which propagates the input optical signal; and with a cavity structure formed in the direction which intersects the optical propagating direction of the first optical waveguide, said the optical signal is amplified by causing stimulated emission.

(21) A semiconductor optical amplifier according to Paragraph (15), wherein: a photonic crystal is provided along a side of the first optical waveguide which propagates the input optical signal; and with a cavity structure formed in the direction which intersects the optical propagating direction of the first optical waveguide, the optical signal is amplified by causing stimulated emission.

(22) A semiconductor optical amplifier according to Paragraph (16), wherein: a photonic crystal is provided along a side of the first optical waveguide which propagates the input optical signal; and with a cavity structure formed in the direction which intersects the optical propagating direction of the first optical waveguide, the optical signal is amplified by causing stimulated emission.

(23) A semiconductor optical amplifier according to Paragraph (17), wherein: a photonic crystal is provided along a side of the first optical waveguide which propagates the input optical signal; and with a cavity structure formed in the direction which intersects the optical propagating direction of the first optical waveguide, the optical signal is amplified by causing stimulated emission.

(24) A semiconductor optical amplifier according to Paragraph (18), wherein: a photonic crystal is provided along a side of the first optical waveguide which propagates the input optical signal; and with a cavity structure formed in the direction which intersects the optical propagating direction of the first optical waveguide, the optical signal is amplified by causing stimulated emission.

(25) A semiconductor optical amplifier according to Paragraph (13) wherein, without injecting current into the first optical waveguide which propagates the input optical signal, the optical signal is amplified by causing stimulated emission by optically pumping carriers in the first optical waveguide with radiation incident on the first optical waveguide from the direction which is included in a plane parallel to the first optical waveguide and intersects the optical propagating direction of the first optical waveguide.

(26) A semiconductor optical amplifier according to Paragraph (14) wherein, without injecting current into the first optical waveguide which propagates the input optical signal, the optical signal is amplified by causing stimulated emission by optically pumping carriers in the first optical waveguide with radiation incident on the first optical waveguide from the-direction which is included in a plane parallel to the first optical waveguide and intersects the optical propagating direction of the first optical waveguide.

(27) A semiconductor optical amplifier according to Paragraph (15) wherein, without injecting current into the first optical waveguide which propagates the input optical signal, the optical signal is amplified by causing stimulated emission by optically pumping carriers in the first optical waveguide with radiation incident on the first optical waveguide from the direction which is included in a plane parallel to the first optical waveguide and intersects the optical propagating direction of the first optical waveguide.

(28) A semiconductor optical amplifier according to Paragraph (16) wherein, without injecting current into the first optical waveguide which propagates the input optical signal, the optical signal is amplified by causing stimulated emission by optically pumping carriers in the first optical waveguide with radiation incident on the first optical waveguide from the direction which is included in a plane parallel to the first optical waveguide and intersects the optical propagating direction of the first optical waveguide.

(29) A semiconductor optical amplifier according to Paragraph (17) wherein, without injecting current into the first optical waveguide which propagates the input optical signal, the optical signal is amplified by causing stimulated emission by optically pumping carriers in the first optical waveguide with radiation incident on the first optical waveguide from the direction which is included in a plane parallel to the first optical waveguide and intersects the optical propagating direction of the first optical waveguide.

(30) A semiconductor optical amplifier according to Paragraph (18) wherein, without injecting current into the first optical waveguide which propagates the input optical signal, the optical signal is amplified by causing stimulated emission by optically pumping carriers in the first optical waveguide with radiation incident on the first optical waveguide from the direction which is included in a plane parallel to the first optical waveguide and intersects the optical propagating direction of the first optical waveguide.

(31) A semiconductor optical amplifier according to Paragraph (19) wherein, without injecting current into the first optical waveguide which propagates the input optical signal, the optical signal is amplified by causing stimulated emission by optically pumping carriers in the first optical waveguide with radiation incident on-the first optical waveguide from the direction which is included in a plane parallel to the first optical waveguide and intersects the optical propagating direction of the first optical waveguide.

(32) A semiconductor optical amplifier according to Paragraph (20) wherein, without injecting current into the first optical waveguide which propagates the input optical signal, the optical signal is amplified by causing stimulated emission by optically pumping carriers in the first optical waveguide with radiation incident on the first optical waveguide from the direction which is included in a plane parallel to the first optical waveguide and intersects the optical propagating direction of the first optical waveguide.

(33) A semiconductor optical amplifier according to Paragraph (21) wherein, without injecting current into the first optical waveguide which propagates the input optical signal, the optical signal is amplified by causing stimulated emission by optically pumping carriers in the first optical waveguide with radiation incident on the first optical waveguide from the direction which is included in a plane parallel to the first optical waveguide and intersects the optical propagating direction of the first optical waveguide.

(34) A semiconductor optical amplifier according to Paragraph (22) wherein, without injecting current into the first optical waveguide which propagates the input optical signal, the optical signal is amplified by causing stimulated emission by optically pumping carriers in the first optical waveguide with radiation incident on the first optical waveguide from the direction which is included in a plane parallel to the first optical waveguide and intersects the optical propagating direction of the first optical waveguide.

(35) A semiconductor optical amplifier according to Paragraph (23) wherein, without injecting current into the first optical waveguide which propagates the input optical signal, the optical signal is amplified by causing stimulated emission by optically pumping carriers in the first optical waveguide with radiation incident on the first optical waveguide from the direction which is included in a plane parallel to the first optical waveguide and intersects the optical propagating direction of the first optical waveguide.

(36) A semiconductor optical amplifier according to Paragraph (24) wherein, without injecting current into the first optical waveguide which propagates the input optical signal, the optical signal is amplified by causing stimulated emission by optically pumping carriers in the first optical waveguide with radiation incident on the first optical waveguide from the direction which is included in a plane parallel to the first optical waveguide and intersects the optical propagating direction of the first optical waveguide.

As described in detail so far, the present invention can substantially prevent the gain from changing depending on the intensity of the input optical signal. Spectrum broadening due to spontaneous emission, accompanied by rising noise level, can also be suppressed according to the present invention.

In addition, integration of components according to the present invention can provide a high function and inexpensive optical amplifier.

Reference numerals are explained as follows:
101 . . . optical waveguide for optical signal, 102 . . . optical waveguide region for lasing, 103 . . . electrode pad, 104 . . . antireflection coating film on facet of optical waveguide for optical signal, 105 . . . coating film on lasing cavity, 106 . . . variable optical attenuator, 107 . . . semiconductor optical amplifier, 108 . . . PIN photodiode, 109 . . . preamplifier, 111 . . . InP substrate, 112 . . . InP buffer layer, 113, 115 . . . InGaAsP cladding layer, 114 . . . InGaAsP waveguide layer, 116 . . . InP cap layer, 117 . . . insulation film, 118 . . . p-electrode (Ti/Pt/Au), 119 . . . n-electrode (Ni/AuGe/Au), 122, 128 . . . InGaAsP cladding layer, 123, 125 . . . InGaAsP SCH layer, 124 . . . InGaAsP MQW active layer, 126 . . . InP spacer layer, 127 . . . InGaAsP grating layer, 128 . . . InP cladding layer, 129 . . . InGaAs contact layer, 130 . . . semi-insulation InP buried layer, 131 . . . 45-degree mirror part, 132, 133 . . . high reflectance dielectric film, 134 . . . n-type semiconductor multi-layered film, 153, 155 . . . InGaAsP SCH layer, 154 . . . InGaAsP MQW active layer, 156 . . . InP cladding layer, 157 . . . InGaAs contact layer, 163, 165 . . . InGaAsP cladding layer, 164 . . . InGaAs optical absorption layer, 166 . . . InGaAs cap layer, 167 . . . InGaAs contact layer, 210 . . . lens, 211 . . . optical fiber, 212 . . . Peltier device

What is claimed is:

1. A semiconductor optical amplifier comprising:
    a first optical waveguide which propagates an input optical signal;
    an optical amplification section for carrying out amplification by causing induction discharge to occur with a resonator structure formed from a direction that, in a plane parallel to the first optical waveguide, intersects the optical propagation direction of the first optical waveguide, the optical amplification section amplifying the optical signal by causing stimulated emission with radiation incident on the first optical waveguide from a direction which is included in a plane parallel to the first optical waveguide and intersects an optical propagating direction of the first optical waveguide, and
    a cavity structure formed in a direction which intersects the optical propagating direction of the first optical waveguide,
    wherein, without injecting current into the first optical waveguide which propagates the input optical signal, the optical signal is amplified by causing stimulated emission by optically pumping carriers in the first optical waveguide with radiation incident on the first optical waveguide from a direction which is included in a plane parallel to the first optical waveguide and intersects the optical propagating direction of the first optical waveguide.

2. A semiconductor optical amplifier according to claim 1, wherein any gain medium to amplify light is not provided around an optical input surface of the first optical waveguide which propagates the input optical signal.

3. A semiconductor optical amplifier according to claim 2, wherein a part or the whole of a gain medium of the first optical waveguide which propagates the input optical signal is used also as a part or the whole of a gain medium of the optical amplification section which amplifies the optical signal.

4. A semiconductor optical amplifier according to claim 3, wherein:
    a photonic crystal is provided along a side of the first optical waveguide which propagates the input optical signal; and
    the optical signal is amplified by allowing a cavity structure to cause stimulated emission, said cavity structure being formed in a plane parallel to the first optical waveguide and in the direction which intersects the optical propagating direction of the first optical waveguide.

5. A semiconductor optical amplifier according to claim 2, wherein:
    a photonic crystal is provided along a side of the first optical waveguide which propagates the input optical signal; and
    the optical signal is amplified by allowing a cavity structure to cause stimulated emission, said cavity structure being formed in a plane parallel to the first optical waveguide and in the direction which intersects the optical propagating direction of the first optical waveguide.

6. A semiconductor optical amplifier according to claim 2 wherein at least some of a gain medium of the first optical waveguide which propagates the input optical signal is different in composition from a gain medium used in a portion which generates radiation incident on the first optical waveguide.

7. A semiconductor optical amplifier according to claim 1, wherein a part or the whole of a gain medium of the first optical waveguide which propagates the input optical signal is used also as a part or the whole of a gain medium of the optical amplification section which amplifies the optical signal.

8. A semiconductor optical amplifier according to claim 7, wherein:
    a photonic crystal is provided along each side of the first optical waveguide which propagates the input optical signal; and
    the optical signal is amplified by allowing a cavity structure to cause stimulated emission, said cavity structure being formed in a plane parallel to the first optical waveguide and in the direction which intersects the optical propagating direction of the first optical waveguide.

9. A semiconductor optical amplifier according to claim 1, wherein:
    a photonic crystal is provided along a side of the first optical waveguide which propagates the input optical signal; and
    the optical signal is amplified by allowing a cavity structure to cause stimulated emission, said cavity structure being formed in a plane parallel to the first optical waveguide and in the direction which intersects the optical propagating direction of the first optical waveguide.

10. A semiconductor optical amplifier according to claim 1 wherein at least some of a gain medium of the first optical waveguide which propagates the input optical signal is different in composition from a gain medium used in a portion which generates radiation incident on the first optical waveguide.

11. A semiconductor optical amplifier according to claim 10, wherein:
    a photonic crystal is provided along a side of the first optical waveguide which propagates the input optical signal; and
    the optical signal is amplified by allowing a cavity structure to cause stimulated emission, said cavity structure being formed in a plane parallel to the first optical waveguide and in the direction which intersects the optical propagating direction of the first optical waveguide.

12. A semiconductor optical amplifier according to claim 6, wherein:
    a photonic crystal is provided along a side of the first optical waveguide which propagates the input optical signal; and
    the optical signal is amplified by allowing a cavity structure to cause stimulated emission, said cavity structure being formed in a plane parallel to the first optical waveguide and in the direction which intersects the optical propagating direction of the first optical waveguide.

* * * * *